US012577650B2

(12) United States Patent
Aono et al.

(10) Patent No.: US 12,577,650 B2
(45) Date of Patent: Mar. 17, 2026

(54) LAMINATE, PACKAGING MATERIAL, AND PACKAGING BODY

(71) Applicant: Toray Industries, Inc., Tokyo (JP)

(72) Inventors: Haruki Aono, Otsu (JP); Yasuyuki Imanishi, Otsu (JP); Masatoshi Ohkura, Otsu (JP)

(73) Assignee: Toray Industries, Inc., Tokyo (JP)

( * ) Notice: Subject to any disclaimer, the term of this patent is extended or adjusted under 35 U.S.C. 154(b) by 186 days.

(21) Appl. No.: 18/573,597

(22) PCT Filed: Jul. 26, 2022

(86) PCT No.: PCT/JP2022/028693
§ 371 (c)(1),
(2) Date: Dec. 22, 2023

(87) PCT Pub. No.: WO2023/008400
PCT Pub. Date: Feb. 2, 2023

(65) Prior Publication Data
US 2024/0318300 A1 Sep. 26, 2024

(30) Foreign Application Priority Data

Jul. 28, 2021 (JP) ................................ 2021-123046
Jul. 28, 2021 (JP) ................................ 2021-123047

(51) Int. Cl.
*C23C 14/08* (2006.01)
*B65D 65/42* (2006.01)

(52) U.S. Cl.
CPC ............ *C23C 14/081* (2013.01); *B65D 65/42* (2013.01)

(58) Field of Classification Search
None
See application file for complete search history.

(56) References Cited

U.S. PATENT DOCUMENTS

| | | | | |
|---|---|---|---|---|
| 2021/0347148 A1* | 11/2021 | Yamada | .................. | B32B 27/34 |
| 2022/0153006 A1 | 5/2022 | Tanaka et al. | | |
| 2023/0249388 A1 | 8/2023 | Yamazaki et al. | | |

FOREIGN PATENT DOCUMENTS

| | | | | | |
|---|---|---|---|---|---|
| JP | 10249989 | A | 9/1998 | | |
| JP | 2000108262 | A | 4/2000 | | |
| JP | 2001225409 | A | 8/2001 | | |
| JP | 2007105893 | A | 4/2007 | | |
| JP | 2021020391 | A | 2/2021 | | |
| JP | 2022035487 | A | 3/2022 | | |
| WO | 2011156053 | A1 | 12/2011 | | |
| WO | 2017221781 | A1 | 12/2017 | | |
| WO | WO-2020045629 | A1 * | 3/2020 | ............. | B32B 7/035 |
| WO | 2022019192 | A1 | 1/2022 | | |
| WO | 2022138531 | A1 | 6/2022 | | |

OTHER PUBLICATIONS

Cumpson, Peter J., et al., "Material dependence of argon cluster ion sputter yield in polymers: Method and measurements of relative sputter yields for 19 polymers", Journal of Vacuum Science and Technology, A 31(2), Mar./Apr. 2013, 5 pages.
International Search Report and Written Opinion for International Application No. PCT/JP2022/028693, dated Oct. 18, 2022, 6 pages.

* cited by examiner

*Primary Examiner* — Michael P. Rodriguez
(74) *Attorney, Agent, or Firm* — Buchanan Ingersoll & Rooney PC

(57) ABSTRACT
A laminate having a polypropylene resin film and an inorganic oxide layer, wherein the laminate is characterized in that the water vapor transmission rate is less than 3.0 $g/m^2/day$, the peel strength of the inorganic oxide layer is 0.7 N/15 mm or more, and when the stress at 121° C. in the main orientation axis direction as measured by thermomechanical analysis (TMA) is denoted by $SF_{121° C.}$ and the stress at 145° C. in the main orientation axis direction is denoted by $SF_{145° C.}$, said laminate satisfies $SF_{145° C.}-SF_{121° C.}\leq2.50$ MPa. The present invention provides a laminate that is suitable for use in applications in which processing and use in a high-temperature environment are required and there is a need to reduce the effects of moisture.

17 Claims, No Drawings

LAMINATE, PACKAGING MATERIAL, AND PACKAGING BODY

CROSS REFERENCE TO RELATED APPLICATIONS

This is the U.S. National Phase application of PCT/JP2022/028693, filed Jul. 26, 2022, which claims priority to Japanese Patent Application No. 2021-123046, filed Jul. 28, 2021 and Japanese Patent Application No. 2021-123047, filed Jul. 28, 2021, the disclosures of each of these applications being incorporated herein by reference in their entireties for all purposes.

FIELD OF THE INVENTION

The present invention particularly relates to a laminate including a polypropylene-based resin film and an inorganic oxide layer, a packaging material, and a packing body, which are suitably used in packaging applications.

BACKGROUND OF THE INVENTION

Polypropylene films are excellent in transparency, mechanical characteristics, electrical characteristics, and the like, and have been thus used in various applications such as packaging applications, tape applications, and electrical insulation applications including cable wrapping and capacitors. Among these applications, in the packaging applications, laminated films of polypropylene films with a thin film of aluminum (hereinafter, which may be referred to as "Al") vapor-deposited thereon are widely used (for example, Patent Document 1). The films obtained by Al vapor deposition are, however, opaque, and thus, not suitable for applications that require visibility of contents. In addition, in recent years, there has been a growing trend toward recycling packaging plastics, and the films including the Al vapor-deposited layer also have the problem of insufficient recyclability.

From such circumstances described above, there is a trend toward replacing the conventional Al vapor-deposited layer with a transparent vapor-deposited layer such as aluminum oxide (hereinafter, which may be referred to as Alox) or silicon oxide (hereinafter, which may be referred to as SiOx). When such a transparent vapor-deposited layer is used, the transparency and recyclability of packaging materials can be improved.

Specifically, for example, Patent Document 2 describes a laminated polypropylene film that has adhesion enhanced by providing an undercoat layer based on a polyester-based polyurethane resin on a polypropylene film and providing a transparent vapor-deposited layer of Alox or SiOx thereon. In addition, Patent Document 3 describes a laminated polypropylene film of a polypropylene film base material subjected to binary vapor deposition of Alox and SiOx.

PATENT DOCUMENTS

Patent Document 1: Japanese Patent Laid-open Publication No. 2007-105893

Patent Document 2: Japanese Patent Laid-open Publication No. 2021-020391

Patent Document 3: International Publication No. 2017-221781

SUMMARY OF THE INVENTION

The laminated polypropylene film in Patent Document 2 has, however, insufficient heat resistance at high temperatures, and has a problem that the water vapor barrier property is likely to be impaired in a post-processing step under a high-temperature environment. In addition, the laminated polypropylene film in Patent Document 3 is insufficient in the heat resistance of the polypropylene film base material and likely to be shrunk under high temperatures, and thus also has the problem of being insufficient in water vapor barrier property. In addition, in the laminated polypropylene film in Patent Document 3 with the thick vapor-deposited layer in the case of binary vapor deposition of Alox and SiOx, cracks and delamination are likely to be caused, which is also a problem. More specifically, the laminated polypropylene films in Patent Documents 2 and 3 have a problem that it is difficult to apply the films to applications that require processing and using the films under high-temperature environments, and at the same time, require reducing the influence of moisture.

Accordingly, an object of the present invention provides a laminate that can be suitably used in applications that require processing and using the laminate under a high-temperature environment, and at the same time, require reducing the influence of moisture.

The inventors of the present invention have carried out intensive studies for solving the problem mentioned above, and made the following present invention. More specifically, an embodiment of the present invention provides a laminate including a polypropylene-based resin film and an inorganic oxide layer, characterized in that the laminate has a water vapor transmission rate of less than 3.0 $g/m^2/day$, the inorganic oxide layer is 0.7 N/15 mm or more in peel strength, and the laminate satisfies $SF_{145^\circ\ C.}-SF_{121^\circ\ C.} \leq 2.50$ MPa, where the stress at 121° C. in the main orientation axis direction and the stress at 145° C. in the main orientation axis direction, measured by thermomechanical analysis (TMA), are denoted respectively by $SF_{121^\circ\ C.}$ and $SF_{145^\circ\ C.}$.

The present invention can provide a laminate that is suitable for applications that require achieving a balance between an excellent water vapor barrier property and the adhesion of an inorganic oxide layer, and require processing and using the laminate under a high-temperature environment, and at the same time, reducing the influence of moisture, for example, a packaging material.

DETAILED DESCRIPTION OF EMBODIMENTS OF THE INVENTION

A laminate according to embodiments of the present invention will be described in detail below. The laminate according to an embodiment of the present invention has a polypropylene-based resin film and an inorganic oxide layer, and the laminate is characterized in that the laminate has a water vapor transmission rate of less than 3.0 $g/m^2/day$, the inorganic oxide layer is 0.7 N/15 mm or more in peel strength, and the laminate satisfies $SF_{145^\circ\ C.}-SF_{121^\circ\ C.} \leq 2.50$ MPa, where the stress at 121° C. in the main orientation axis direction and the stress at 145° C. in the main orientation axis direction, measured by thermomechanical analysis (TMA), are denoted respectively by $SF_{121^\circ\ C.}$ and $SF_{145^\circ\ C.}$.

First, the laminate according to embodiments of the present invention has a polypropylene-based resin film and an inorganic oxide layer. In embodiments of the present invention, the polypropylene-based resin film refers to a sheet-shaped molded body containing a polypropylene-based resin in an amount of 80% by mass or more and 100% by mass or less based on all of the constituent components considered as 100% by mass, and with the content of the polypropylene-based resin in the surface layer of 1 μm being 80% by mass or more and 100% by mass or less at any face. Specific examples thereof include a film composed of a single layer or multiple layers containing a polypropylene-based resin in an amount of 80% by mass or more and 100% by mass or less, and such a film that has, on at least one surface layer thereof, a layer (hereinafter, which may be referred to as an anchor layer) of 200 nm or less in thickness, containing, as a main component, a component other than the polypropylene-based resin. In the latter example, the thickness of the layer is preferably 100 nm or less, more preferably 50 nm or less, still more preferably 20 nm or less. This is because the simplified laminated configuration and the reduced content of components other than the polypropylene-based resin in the entire laminate improve the production cost and recyclability of the laminate. The polypropylene-based resin refers to a resin in which a propylene unit accounts for 90 mol % or more and 100 mol % or less based on all of the constituent units constituting the resin considered as 100 mol %, and hereinafter, the same can apply to resins of other systems. Further, as the polypropylene (PP)-based resin, so-called biomass-derived bio-PP or so-called recycled PP produced by chemical recycling or material recycling is also suitably used.

In addition, the inorganic oxide layer is a layer containing: one or more elements selected from Groups 2 to 14 (excluding carbon) of the periodic table; and oxygen, with the carbon element being 15 atomic % or less based on all of the elements detected by X-ray photoelectron spectroscopy (XPS) considered as 100 atomic %. This inorganic oxide layer mainly plays a role of enhancing the water vapor barrier property of the laminate. Among the elements selected from Groups 2 to 14 (excluding carbon) of the periodic table, from the viewpoints of processing cost and gas barrier properties, it is preferable to contain one or more selected from aluminum, magnesium, titanium, tin, indium, and silicon, it is more preferable to contain one or more selected from aluminum and silicon, and it is still more preferable to contain one type of aluminum. In addition, the proportion of the oxygen element in the inorganic oxide layer, measured by X-ray photoelectron spectroscopy (XPS), is preferably 1 atomic % or more and 80 atomic % or less. The inorganic oxide layer can be laminated by using a known method such as a vacuum vapor deposition method, a sputtering method, an ion plating method, or a plasma vapor phase growth method, and is preferably a vapor-deposited layer formed by a vacuum vapor deposition method from the viewpoint of being capable of forming a film at high speed with high productivity.

The thickness of the inorganic oxide layer is preferably 2 nm or more and 30 nm or less, more preferably 2 nm or more and 20 nm or less, still more preferably 2 nm or more and 15 nm or less, particularly preferably 2 nm or more and less than 10 nm. The thickness of the inorganic oxide layer is set to be 2 nm or more, thereby allowing defects such as pinholes in the inorganic oxide layer to be reduced to improve the water vapor barrier property of the laminate. In addition, the thickness is set to be 30 nm or less, thereby allowing a flexible inorganic oxide layer that is less likely to be cracked, and allowing the inorganic oxide layer to be sufficiently oxidized to provide a high-quality film, and thus, the water vapor barrier property of the laminate can be improved. It is to be noted that the thickness of the inorganic oxide layer is measured by cross-sectional observation with a transmission electron microscope (TEM), and the detailed measurement method will be described later.

In the laminate according to embodiments of the present invention, it is important for the water vapor transmission rate to be less than 3.0 g/m$^2$/day from the viewpoint of application to uses that require the property for reducing the influence of moisture. The water vapor transmission rate is set to be less than 3.0 g/m$^2$/day, thereby allowing moisture absorption by the content and then deterioration of the contents to be reduced, for example, in the case of using the laminate for a packaging material. From the viewpoint mentioned above, the water vapor transmission rate is preferably 2.0 g/m$^2$/day or less, more preferably 1.5 g/m$^2$/day or less, still more preferably 1.0 g/m$^2$/day or less. In addition, the water vapor transmission rate is preferably as low as possible, and the lower limit thereof is not particularly limited, but the water vapor transmission rate is substantially 0.01 g/m$^2$/day or more. Further, the water vapor transmission rate can be measured under conditions of temperature: 40° C. and humidity: 90% RH in accordance with the method B of JIS K 7129 (2008), and the detailed measurement method will be described later.

The method for setting the water vapor transmission rate to be less than 3.0 g/m$^2$/day or in the preferred range mentioned above is not particularly limited, and for example, a method of setting the tan δ of the main orientation axis direction of the laminate at 145° C. to be 0.25 or less, a method of setting the thickness of the inorganic oxide layer to be 2 nm or more and 30 nm or less, a method of setting the St value of the surface of the inorganic oxide layer to be 700 nm or less, a method of setting the Sku value of the surface of the inorganic oxide layer to be 300 or less, a method of applying a heating relaxation treatment in a longitudinal stretching step at the time of forming the polypropylene-based resin film constituting the laminate, a method of setting the molecular weight distribution Mz/Mw of the polypropylene-based resin composition to be 1.5 or more and 4.5 or less, and the like can be used. In addition, examples of the method for setting the water vapor transmission rate also include a method in which polypropylene-based resin film has a laminated configuration as described later according to an aspect of a layer C containing a petroleum resin in an amount of 3% by mass or more and 20% by mass or less based on all of the components constituting the layer C considered as 100% by mass. It is to be noted that these methods are not considered as essential requirements, and can be combined appropriately.

In addition, in the laminate according to embodiments of the present invention, it is important for the peel strength of the inorganic oxide layer to be 0.7 N/15 mm or more. The peel strength of the inorganic oxide layer refers to the peel strength between the polypropylene-based resin film and the inorganic oxide layer, and can be measured by laminating a polypropylene film with an adhesive on the surface with the inorganic oxide layer laminated thereon, and peeling the film. The detailed measurement method will be described later. The peel strength of the inorganic oxide layer is set to be 0.7 N/15 mm or more, thereby allowing the water vapor barrier property to be prevented from being deteriorated by the polypropylene-based resin film and inorganic oxide layer naturally peeled off at the time of bag-making processing or at the time of conveyance. Thus, the reliability in the case of using the laminate according to embodiments of the present invention for a packaging material is improved. From the viewpoint mentioned above, the lower limit of the peel strength of the inorganic oxide layer is preferably 0.8 N/15 mm, more preferably 1.0 N/15 mm, still more preferably 1.2 N/15 mm, particularly preferably 1.5 N/15 mm. Because the peel strength of the inorganic oxide layer is preferably as high as possible, the upper limit thereof is not particularly limited, but is substantially about 10.0 N/15 mm.

The method for setting the peel strength of the inorganic oxide layer to be 0.7 N/15 mm or more or in the preferred range mentioned above is not particularly limited, and examples thereof include a method of adjusting the melting point of the resin composition of a surface layer (A layer described later) of the polypropylene-based resin film on the side in contact with the inorganic oxide layer to fall within a range that has a lower limit of 150° C., preferably 152° C., more preferably 154° C., and has an upper limit of 167° C., preferably 164° C., more preferably 163° C. In addition, the examples also include a method of adjusting the melting enthalpy ΔHm of the surface layer (A layer described later) to fall within a range that has a lower limit of 70 J/g, preferably 75 J/g, more preferably 80 J/g, and an upper limit of 110 J/g, preferably 105 J/g, more preferably 100 J/g. In addition, the examples also include a method employed such that the surface of the polypropylene-based resin film with the inorganic oxide layer provided has 30 atomic % or more carbon atoms, 40 atomic % or less oxygen atoms, and 25 atomic % or less metal atoms analyzed and then detected by X-ray photoelectron spectroscopy (XPS). The examples also include, as still another method, a method of performing a corona discharge treatment, and additionally, a method of performing a plasma treatment and a method of performing an ion beam treatment, in the air or in an atmosphere gas of oxygen, nitrogen, hydrogen, argon, a carbon dioxide gas, a silane gas, or a mixture thereof, for the surface of the polypropylene-based resin film on the side on which the inorganic oxide layer is to be laminated, in producing the laminate. In particular, as for the corona discharge treatment, it is effective to perform the treatment in an atmosphere gas with an oxygen concentration of 10% or less, preferably 5% or less, more preferably 1% or less, and as a specific aspect of the atmosphere gas with an oxygen concentration of 1% or less, it is effective to employ, in particular, a nitrogen gas, a carbon dioxide gas, or a mixture thereof. In addition, a method of combining the above-described corona discharge treatment in the atmosphere gas with the plasma treatment or the ion beam treatment is also effective. Performing such a treatment allows a hydrophilic functional group to be efficiently introduced while inhibiting the generation of a low-molecular-weight product with polypropylene molecular chain scission at the surface of the polypropylene-based resin film, thereby facilitating the control of the peel strength of the inorganic oxide layer to 0.7 N/15 mm or more. Examples of the other methods include a method of providing, on the surface of the polypropylene-based resin film on the side in contact with the inorganic oxide layer, a layer (anchor layer) of 200 nm or less in thickness, containing a component other than the polypropylene-based resin or the inorganic oxide as a main component. It is to be noted that while it is not essential to combine all of these methods, an appropriate combination thereof may be used, and it is particularly effective to perform the corona treatment (furthermore, the ion beam treatment) in the atmosphere gas described above, with the melting point and melting enthalpy ΔHm of the resin composition of the surface layer within the ranges mentioned above.

In addition, it is important for the laminate according to embodiments of the present invention to satisfy $SF_{145°\ C.}-SF_{121°\ C.} \leq 2.50$ MPa, where the stress at 121° C. in the main orientation axis direction and the stress at 145° C. in the main orientation axis direction, measured by thermomechanical analysis (TMA), are denoted respectively by $SF_{121°\ C.}$ and $SF_{145°\ C.}$. The main orientation axis direction of the laminate refers to a direction in which the stress of the maximum point strength obtained from the maximum load until fracture is maximized, determined when a rectangular sample of 50 mm in length (measurement direction)×of 10 mm in width is pulled in the measurement direction at a tensile speed of 300 mm/min at room temperature, and details of the determination method will be described later. Satisfying $SF_{145°\ C.}-SF_{121°\ C.} \leq 2.50$ MPa allows defects such as pinholes and cracks to be kept from being generated in the inorganic oxide layer due to deformation of the laminate by heat when the laminate according to embodiments of the present invention is subjected to post-processing including a high-temperature treatment such as heat sealing. As a result, the laminate becomes capable of maintaining the excellent water vapor barrier property.

Satisfying $SF_{145°\ C.}-SF_{121°\ C.} \leq 2.50$ MPa means small shrinkage stress in a high-temperature range of 121° C. or higher. In the case of small shrinkage stress in a high-temperature range of 121° C. or higher, the shrinkage stress is further reduced in a temperature range from lower than 121° C. to room temperature, thereby extremely reducing the dimensional change with time. Thus, dimensional stability in storing the laminate according to embodiments of the present invention as a roll for a long period of time is improved, thereby allowing deformations of the roll, for example, winkle generation (winding tightness) to be suppressed.

Having such characteristics reduces the deterioration in quality due to the generation of wrinkles (winding tightness) of the roll itself or thickness unevenness thereof in the width direction, when the laminate is, after long-term storage thereof, to be subjected to post-processing such as printing, lamination, or bag-making processing to form a final product such as a bag for food packaging. As a result, sites that are forced to be discarded as defective products due to a printing deviation or the like caused by such a deterioration in quality can be reduced to increase the yield of the final product. It is to be noted that the deterioration in the quality of the laminate can be evaluated by dimensional stability in the case of long-term storage in the form of the roll, and the evaluation method will be described later. From the viewpoint mentioned above, the upper limit of $SF_{145°\ C.}-SF_{121°\ C.}$ is preferably 2.00 MPa, more preferably 1.80 MPa, still more preferably 1.70 MPa, particularly preferably 1.50 MPa. Further, $SF_{145°\ C.}-SF_{121°\ C.}$ is preferably as small as possible, and the lower limit is not particularly limited, but is substantially about 0.05 MPa.

$SF_{145°\ C.}$ and $SF_{121°\ C.}$ can be read from thermal shrinkage stress curves obtained by performing thermomechanical analysis under the temperature conditions and load conditions shown in Examples. The thermomechanical analyzer is not particularly limited as long as the analyzer is capable of the measurement, and can be appropriately selected, and for example, TMA/SS 6000 (manufactured by Seiko Instruments Inc.) or the like can be used.

The method for controlling $SF_{145°\ C.}-SF_{121°\ C.}$ of the laminate to 2.50 MPa or less or in the preferred range mentioned above is not to be considered particularly limited, and examples thereof include a method of adjusting conditions for a tenter device in the formation of the polypropylene-based resin film constituting the laminate. More specific examples thereof include a method of setting the lower limit of the heat treatment temperature of the tenter to be 140° C., more preferably 150° C., still more preferably 155° C., particularly preferably 161° C., and the upper limit thereof to be 167° C., more preferably 166° C., still more preferably 165° C.; and a method of setting the lower limit of the relax ratio to be 2%, more preferably 5%, still more preferably 7%, particularly preferably 98, and the upper limit thereof to be 20%, more preferably 18%, still more preferably 17%, particularly preferably 15%. When the heat treatment temperature of the tenter is set to be 168° C. or higher, relaxing molecular chains strongly oriented in the main orientation axis direction may make it difficult to control $SF_{145° C.} - SF_{121° C.}$ to 2.50 MPa or less. In addition, the examples also include, for the polypropylene-based resin composition constituting the polypropylene-based resin film, a method of setting the molecular weight distribution Mz/Mw to be 1.5 or more and 4.5 or less, and a method of setting the differential distribution value obtained when the logarithmic molecular weight Log (M) is 6.5 to be 1.0% or more and 10% or less. Furthermore, the examples also include a method in which polypropylene-based resin film has a composite configuration as described later according to an aspect of a layer C containing a petroleum resin in an amount of 3% by mass or more and 20% by mass or less based on all of the components constituting the layer C considered as 100% by mass. It is to be noted that these methods are not considered as essential requirements, and can be combined appropriately.

In the laminate according to embodiments of the present invention, the tan δ of the main orientation axis direction at 145° C. is preferably 0.25 or less. The tan δ, which is also referred to as loss tangent, correlates with the degree of mobility of the molecular chain of the resin constituting the laminate, and generally increases as the temperature increases in a range of 100° C. or higher. The tan δ of the main orientation axis direction at 145° C. is an index that correlates with the degree of mobility of the molecular chain in the film at around 145° C. Reducing this value, in other words, suppressing the movements of the molecular chains at high temperatures suppresses the thermal shrinkage stress of the laminate under high temperatures, thereby making it easy to satisfy $SF_{145° C.} - SF_{121° C.} \leq 2.50$ MPa, where the stress at 121° C. in the main orientation axis direction and the stress at 145° C. in the main orientation axis direction, measured by thermomechanical analysis (TMA), are denoted respectively by $SF_{121° C.}$ and $SF_{145° C.}$. From the viewpoint mentioned above, the tan δ of the main orientation axis direction at 145° C. is preferably 0.23 or less, more preferably 0.21 or less, still more preferably 0.19 or less. Further, the tan δ of the main orientation axis direction at 145° C. is preferably as small as possible, and the lower limit thereof is not particularly limited, but is substantially about 0.01. The tan δ can be determined from a viscoelasticity-temperature curve until reaching 180° C. from –100° C. after the start of temperature rise after low-temperature cooling to –100° C., and details of the measurement method will be described later.

The method for setting the tan δ of the main orientation axis direction of the laminate at 145° C. to be 0.25 or less is not particularly limited, and examples thereof include a method of reducing the molecular weight distribution Mz/Mw of the resin composition constituting the polypropylene-based film, a method of performing a heating relaxation treatment after uniaxial stretching in a step of forming the polypropylene-based resin film, a method of increasing the heat treatment temperature of the tenter, and a method of increasing the relaxation ratio of the tenter. Using these methods alone or in appropriate combination allows the tan δ to be reduced.

In the laminate according to embodiments of the present invention, the inorganic oxide layer preferably has direct contact with the surface of the polypropylene-based resin film. In embodiments of the present invention, "having direct contact" refers to an aspect in which another layer of more than 200 nm in thickness is not present between the polypropylene-based resin film and the inorganic oxide layer. Employing such an aspect improves the production cost and recyclability of the laminate. When the anchor layer is provided between the polypropylene-based resin and the inorganic oxide layer, the thickness thereof needs to be 200 nm or less, and is preferably 100 nm or less, more preferably 50 nm or less, still more preferably 20 nm or less. Although a method for evaluating the recyclability will be described later, typically, a component that has high compatibility with the polypropylene-based resin, for example, a polyethylene resin, a petroleum resin, or the like has no or little influence on the recyclability, whereas a component that has low compatibility with the polypropylene-based resin, for example, a resin such as an ethylene-vinyl alcohol copolymer (EVOH), a polyvinylidene chloride, nylon, a urethane-based resin, or an acryl-based resin, which can be suitably used for an anchor layer, may produce foreign matters such as a gelled product in a recycling step, thereby decreasing the recyclability.

The layer configuration of the laminate can be confirmed by transmission electron microscope (TEM) observation of a sample cross section. It is to be noted that when the vicinity of the surface layer of the polypropylene-based resin film is subjected to a modification such as introducing a functional group or reducing the molecular weight by a surface treatment such as the corona treatment, plasma treatment, or ion beam treatment described later, the modified region is not regarded as a layer that is separate from the unmodified part.

Examples of the method for an aspect of the laminate in which the inorganic oxide layer has direct contact with the surface of the polypropylene-based resin film include a method of laminating the inorganic oxide layer by vapor deposition or the like on the surface of the polypropylene-based resin film, without passing through any step of laminating a coating layer or the like after the formation of the polypropylene-based resin film, and a method of laminating a layer (anchor layer) of 200 nm or less in thickness, containing a component other than the polypropylene-based resin as a main component, by coating or the like on the surface of the polypropylene-based resin film, and laminating an inorganic oxide layer thereon by vapor deposition or the like.

In addition, in the laminate according to embodiments of the present invention, the surface of the inorganic oxide layer preferably has an St value 700 nm or less. The St value herein refers to the St value of a maximum cross-sectional height measured by three-dimensional non-contact surface profile measurement, and details of the measurement method will be described later. The fact that the surface of the inorganic oxide layer has an St value of 700 nm or less means that the surface is sufficiently smooth without having coarse protrusions or the like. Accordingly, employing such an aspect makes the thickness of the inorganic oxide layer uniform to reduce defects such as pinholes and cracks in the inorganic oxide layer, thus allowing the water vapor barrier property of the laminate to be improved. From the viewpoint mentioned above, the upper limit of the St value is preferably 600 nm, more preferably 500 nm. In addition, the lower limit of the St value is 100 nm from the viewpoint of forming irregularities to the extent of imparting appropriate slipperiness to the laminate to improve the conveyability.

The method for controlling the St value of the surface of the inorganic oxide layer to be 700 nm or less or in the preferred range mentioned above is not to be considered particularly limited, but examples of the method include, in the formation of the polypropylene-based resin film, a method of setting the temperature of a spinneret to be 260° C. or lower, more preferably 240° C. or lower, a method of setting the temperature of a casting drum to be 30° C. or lower, a method of setting the stretching ratio in the longitudinal direction to be 4.5 times or more, a method of setting the heat treatment temperature of the tenter to be 167° C. or lower, more preferably 166° C. or lower, still more preferably 165° C. or lower, the fact that the surface layer on the side in contact with the inorganic oxide layer does not contain inorganic or organic particles such as alumina, silica, a crosslinked silicone, and a crosslinked polymethyl methacrylate, in excess of 300 nm (preferably 200 nm or more) in average particle diameter, which cause coarse protrusions, in an amount of 1% by mass or more, more preferably 0.5% by mass or more, still more preferably 0.3% by mass or more, particularly preferably 0.2% by mass or more based on the 100% by mass of whole resin of the layer, and performing a relaxation treatment after longitudinal stretching. More specifically, the St value of the surface of the inorganic oxide layer can be controlled to be 700 nm or less or in the preferred range mentioned above by lowering the temperature of the spinneret, lowering the temperature of the casting drum, increasing the stretching ratio in the longitudinal direction, lowering the heat treatment temperature of the tenter, the fact that the layer that forms the inorganic oxide layer contains none of the particles mentioned above, or the like. Further, these methods can be used in appropriate combination, it is not essential to combine all of the methods, and particularly effective are: lowering the temperature of the spinneret; and the fact that the surface layer on the side in contact with the inorganic oxide layer does not contain the particles in an amount of 1% by mass or more, more preferably 0.5% by mass or more, still more preferably 0.3% by mass or more, particularly preferably 0.2% by mass or more based on the 100% by mass of whole resin of the layer.

In the laminate according to embodiments of the present invention, the surface of the inorganic oxide layer preferably has an Sku value of 300 or less. The Sku herein refers to Sku (kurtosis) measured by three-dimensional non-contact surface profile measurement. The fact that the surface of the inorganic oxide layer has an Sku value of 300 or less means that the surface is sufficiently smooth without having coarse protrusions or the like. Accordingly, the thickness of the inorganic oxide layer is made uniform to reduce defects such as pinholes and cracks in the inorganic oxide layer, thus allowing the water vapor barrier property of the laminate to be improved. From the viewpoint mentioned above, the upper limit of the Sku value is preferably 100, more preferably 10. In addition, the lower limit of the Sku value is 1.0 from the viewpoint of forming irregularities to the extent of imparting appropriate slipperiness to the laminate to improve the conveyability.

The method for controlling the Sku value of the surface of the inorganic oxide layer to be 300 or less or in the preferred range mentioned above is not to be considered particularly limited, the same methods as those for the method for controlling the St value of the surface of the inorganic oxide layer to be 700 nm or less or in the preferred range mentioned above can be used, and particularly effective among the methods are: the method employed such that the surface layer on the side in contact with the inorganic oxide layer does not contain inorganic or organic particles such as alumina, silica, a crosslinked silicone, and a crosslinked polymethyl methacrylate, in excess of 300 nm (preferably 200 nm or more) in average particle diameter, which cause coarse protrusions, in an amount of 1% by mass or more, more preferably 0.5% by mass or more, still more preferably 0.3% by mass or more, particularly preferably 0.2% by mass or more based on the 100% by mass of whole resin of the layer; and a method of setting the temperature of the spinneret to be 260° C. or lower, more preferably 240° C. or lower. In addition, the method of applying the heating relaxation treatment after uniaxial stretching is also effective because the stretching uniformity in stretching in the width direction can be enhanced to smooth a steep pointed part of the film surface. It is to be noted that these methods can be used in appropriate combination, while it is not essential to combine all of the methods.

The Sku value and the St value can be measured with a known three-dimensional non-contact surface profile measuring instrument (e.g., a scanning white-light interference microscope from Hitachi High-Tech Science Corporation) and an analysis system attached thereto, and the detailed measurement conditions and analysis conditions are described in Examples.

In the laminate according to embodiments of the present invention, $F5(x)/F5(y)$ is preferably 1.3 or more and 5.0 or less, where the F5 value in the main orientation axis direction and the F5 value in the direction orthogonal to the main orientation axis are denoted respectively by $F5(x)$ and $F5(y)$. $F5(x)$ refers to a value obtained by dividing a load applied in the case of pulling a rectangular sample (10 mm in the direction orthogonal to main orientation axis (short side)× 150 mm in the main orientation axis direction (long side)) at a tensile speed of 300 mm/min under an environment at room temperature to reach an elongation of 5%, by the cross-sectional area (film thickness×10 mm) of the sample before the test (unit: MPa). The same applies to $F5(y)$ except that the measurement direction is changed.

Setting $F5(x)/F5(y)$ to be 1.3 or more and 5.0 or less improves the balance between the rigidity in the longitudinal direction of the laminate and the rigidity in the width direction thereof, and then makes the inorganic oxide layer less likely to be cracked by a conveyance step after the production, handling, or the like, thus making it easy to maintain the favorable water vapor barrier property of the laminate. From the viewpoint mentioned above, the range of $F5(x)/F5(y)$ is more preferably 1.7 or more and 4.0 or less, still more preferably 1.9 or more and 3.5 or less, particularly preferably 2.1 or more and 3.5 or less.

The method for setting $F5(x)/F5(y)$ to be 1.3 or more and 5.0 or less is not particularly limited, and examples thereof include: a method of setting the molecular weight distribution Mz/Mw of the polypropylene-based resin composition to be 1.5 or more and 4.5 or less; and a method of setting, in the formation of the polypropylene-based resin film, the stretching ratio in the longitudinal direction to be 4.5 times or more and 8.0 times or less, preferably 4.5 times or more and 6.0 times or less, and the stretch ratio in the width direction to be 8.0 times or more and 16 times or less, preferably 9.0 times or more and 12 times or less, and then setting the stretching ratios not to be equal to each other.

In addition, the laminate according to embodiments of the present invention preferably has an oxygen transmission rate of 60 cc/m²/day or less. Such a range allows, in the case of using the laminate for, for example, food packaging, the contents to be kept from being subjected to oxidative degradation, thereby prolonging the life of the contents. From the viewpoint mentioned above, the oxygen transmission rate is more preferably 40 cc/m²/day or less, still more preferably 20 cc/m²/day or less, particularly preferably 1 cc/m²/day or less, most preferably 0.5 cc/m²/day or less. The oxygen transmission rate is preferably as low as possible, and the lower limit thereof is not particularly limited, but the oxygen transmission rate is substantially about 0.01 cc/m²/day. Further, the oxygen transmission rate can be measured by an isobaric method in accordance with JIS K 7126-2 (2006), and the detailed conditions and the like thereof are shown in Examples.

The method for setting the oxygen transmission rate to be 20 cc/m²/day or less or in the preferred range mentioned above is not to be considered particularly limited, and examples thereof include a method of laminating a topcoat layer that has an oxygen barrier property described later. In addition, a method of setting the tan δ of the main orientation axis direction of the laminate at 145° C. to be 0.25 or less, a method of setting the St value of the surface of the inorganic oxide layer to be 700 nm or less, a method of setting the Sku value of the surface of the inorganic oxide layer to be 300 or less, a method of applying a heating relaxation treatment in a longitudinal stretching step in the formation of the polypropylene-based resin film constituting the laminate, a method of setting the molecular weight distribution Mz/Mw of the polypropylene-based resin composition to be 1.5 or more and 4.5 or less, and the like can be used in appropriate combination.

The laminate according to embodiments of the present invention preferably has a thickness of 8 μm or more and 60 μm or less, from the viewpoint of making the laminate suitable for packaging applications. The thickness is set to be 8 μm or more, thereby allowing rigidity to be imparted to the laminate to make the laminate less likely to be broken against sagging and tension at the time of bag-making processing or conveyance. From the viewpoint mentioned above, the lower limit of the thickness is more preferably 10 μm, still more preferably 12 μm. In contrast, the thickness is set to be 60 μm or less, thereby allowing the handleability to be improved, and also allowing the production cost to be reduced. From the viewpoint mentioned above, the upper limit of the thickness is more preferably 50 μm, still more preferably 40 μm, particularly preferably 30 μm. Further, the thickness of the laminate can be determined by measuring the thickness at 10 optional positions of the laminate with a contact-type micrometer under an atmosphere of 23° C. and 65% RH, and obtaining the arithmetic average value for all of the obtained measurement values.

The method for setting the thickness of the laminate to be 8 μm or more and 60 μm or less or in the preferred range mentioned above is not particularly limited, and for example, a method of adjusting the discharge amount in melt-extrusion of the polypropylene-based resin composition, a method of adjusting the rotation speed of a cast drum at the time of cooling solidification of a molten sheet, a method of adjusting a lip gap of a spinneret for discharging the molten sheet, a method of adjusting the stretching ratio in the longitudinal direction, a method of adjusting the stretching ratio in the width direction, and the like can be used in the formation of the polypropylene-based resin film constituting the laminate. More specifically, the thickness can be reduced by reducing the discharge amount, increasing the rotation speed of the cast drum, reducing the lip gap of the spinneret, or increasing the stretching ratio in the longitudinal direction or width direction.

In the laminate according to embodiments of the present invention, the content of the polypropylene-based resin in the whole is preferably 90% by mass or more, more preferably 95% by mass or more, still more preferably 97% by mass or more, still more preferably 98% by mass or more. Such a range allows the laminate to be regarded as a material composed substantially of a single material, that is, a mono-material material, and allows the recyclability to be improved. From the viewpoint mentioned above and the viewpoint of feasibility, the upper limit of the content of the polypropylene-based resin in the whole laminate is 100% by mass.

The layer configuration of the polypropylene-based resin film constituting the laminate according to embodiments of the present invention may be a configuration including one or multiple layers (hereinafter, which may be referred to as a polypropylene-based resin layers) containing the polypropylene-based resin in an amount of 80% by mass or more and 100% by mass or less in all of the components constituting the layers. Hereinafter, the layer configuration of the polypropylene-based resin film will be specifically described. Here, among the polypropylene-based resin layers, the layer closest to the inorganic oxide layer (in the case of one polypropylene-based resin layer, the layer) is defined as an A layer, the layer farthest from the A layer (a layer that is not the A layer in the case of a two-layer configuration) is defined as a B layer, and when there is any polypropylene-based resin layer located between the A layer and the B layer, these layers are defined in the order from the layer closest to layer A as a C layer and a D layer in the alphabetical order. In this regard, in the case of having three or more polypropylene-based resin layers, the A layer and the B layer are also allowed to have the same composition.

In addition, for purposes such as enhancing the adhesion to the inorganic oxide layer, a layer (anchor layer) other than the polypropylene-based resin layer may be provided on the surface of the A layer, if necessary, but the thickness thereof is 200 nm or less, preferably 100 nm or less, more preferably 50 nm or less, still more preferably 20 nm or less. Such a configuration allows the recyclability of the laminate according to embodiments of the present invention to be improved.

A preferred layer configuration of the laminate according to embodiments of the present invention is inorganic oxide layer/polypropylene-based resin film, or topcoat layer (described later)/inorganic oxide layer/polypropylene-based resin film. (Further, an aspect in which the polypropylene-based resin film includes an anchor layer of 200 nm or less in thickness is also acceptable.) Specific examples include aspects such as inorganic oxide layer/A layer, inorganic oxide layer/A layer/B layer, inorganic oxide layer/A layer/C layer/B layer, topcoat layer/inorganic oxide layer/A layer, topcoat layer/inorganic oxide layer/A layer/B layer, and topcoat layer/inorganic oxide layer/A layer/C layer/B layer. Hereinafter, preferred aspects of the respective layers constituting the polypropylene-based resin film will be described.

The A layer contains the polypropylene-based resin as a main component, and preferably does not contain inorganic or organic particles such as alumina, silica, a crosslinked silicone, and a crosslinked polymethyl methacrylate, in excess of 300 nm (preferably 200 nm or more) in average particle diameter, which cause coarse protrusions, in an amount of 1% by mass or more, more preferably 0.5% by mass or more, still more preferably 0.3% by mass or more, particularly preferably 0.2% by mass or more based on the 100% by mass of whole resin of the A layer. Such a composition facilitates controlling the surface roughness (St value or Sku value) of the laminate to be small.

The B layer preferably contains a small amount of a thermoplastic resin that is incompatible with the polypropylene-based resin. Hereinafter, the "thermoplastic resin that is incompatible with the polypropylene-based resin" may be referred to simply as an "incompatible resin". In general, because appropriate conveyability is required in vapor deposition processing and bag-making processing, conventionally, a method has been employed in which irregularities are formed at a film surface by, for example, adding inorganic or organic particles such as alumina, silica, a crosslinked silicone, and a crosslinked polymethyl methacrylate of 200 nm or more in average particle diameter, or an organic lubricant to a film surface layer (e.g., the A layer or the B layer) to impart lubricity. The protrusions formed by such particles are, however, hard, and when a laminate produced from the polypropylene-based resin film is transferred as a wound roll form of product, scraped against the facing inorganic oxide layer, thereby causing defects such as pinholes and cracks. Thus, when such particles are used, the water vapor barrier property of the laminate is likely to be impaired. In addition, the organic particles are likely to be transferred onto the facing surface layer (for example, the layer A) in transferring the polypropylene-based resin film as a wound roll form of product, and decrease the peel strength of the inorganic oxide layer when the inorganic oxide layer is laminated on the polypropylene-based resin film. The B layer contains a small amount of incompatible resin, thereby allowing the B layer surface to be provided with soft surface irregularities obtained through the utilization of the domain structure of the B layer surface. Therefore, the water vapor barrier property of the laminate and the peel strength of the inorganic oxide layer can be both improved without impairing the appropriate slipperiness.

As the incompatible resin, for example, a polymethylpentene-based resin can be used in a preferred manner. When the B layer contains the polypropylene-based resin and the incompatible resin, interfacial peeling between the incompatible resin domain and the polypropylene-based resin, associated with stretching, can be suppressed by making the α-spherulite size of the cast film (unstretched polypropylene film) microscopic or forming all or some of the polypropylene-based resin component as a mesomorphic phase. Suppressing the interfacial peeling allows surface protrusions to be formed without whitening the polypropylene film, and makes uneven vapor deposition due to wrinkles in vapor deposition processing and conveyance wrinkles at the time of bag-making processing less likely to be generated, thereby allowing favorable processing suitability to be obtained.

The content of the incompatible resin in the B layer is preferably 0.1% by mass or more and 10% by mass or less in the 100% by mass of whole layer. The content is more preferably 0.5% by mass or more and 6.0% by mass or less, still more preferably 1% by mass or more and 4% by mass or less, particularly preferably 1.0% by mass or more and 2.0% by mass or less. The content of the incompatible resin is 0.1% by mass or more, thereby causing surface protrusions to be efficiently formed at the B layer surface, thus improving the slipperiness of the B layer surface, and reducing the generation of wrinkles in vapor deposition processing and bag-making processing. In contrast, the content of the incompatible resin in the B layer is 10% by mass or less, thereby inhibiting excessive domain formation in the B layer, and reducing a decrease in transparency due to excessive generation of voids generated at the interface between resins at the time of stretching.

Further, an aspect in which not only the B layer but also the A layer contain the incompatible resin is also preferably employed. Such an aspect allows the surface of the A layer to be provided with fine and soft surface irregularities obtained through the utilization of the domain structure of the surface. Thus, appropriate slipperiness can be imparted without using particles or a lubricant, and for the laminate with the inorganic oxide layer laminated, the handleability can be improved without deteriorating the water vapor barrier property or the oxygen barrier property. The content in the case of the A layer containing the incompatible resin is preferably 0.1% by mass or more and 10% by mass or less in the 100% by mass of whole layer. The content is more preferably 0.5% by mass or more and 6.0% by mass or less, still more preferably 1% by mass or more and 4% by mass or less.

In addition, the B layer can also play a role as a heat seal layer. The heat seal refers to, for the achievement of the form as a bag obtained by filling with/packaging contents, the condition of (or step for) films melted and pressure-bonded through a heat treatment, and the heat sealability refers to a property on the film side melted/pressure-bonded by heating. In addition, the heat seal layer refers to a layer containing more than 50% by mass and 100% by mass or less, preferably 70% by mass or more and 100% by mass or less of a polypropylene-based resin with a melting point lower than 150° C. in the 100% by mass of whole layer. Such an aspect facilitates the achievement of the form as a bag by heating.

In the case where the B layer plays a role as a heat seal layer, the B layer preferably includes a low-melting-point polypropylene-based resin with low crystallinity from the viewpoint of imparting low-temperature and high-speed heat sealability, and specifically, an ethylene-propylene random copolymer, an ethylene-propylene-butene random copolymer, a propylene-butene random copolymer, and the like can be preferably used. In addition, the B layer may contain an elastomer such as ethylene-propylene, ethylene-butene, or propylene-butene.

In addition, in the case where the B layer plays a role as a heat seal layer, the melting point of the B layer is preferably 100° C. or higher and lower than 150° C., more preferably 110° C. or higher and 148° C. or lower, still more preferably 120° C. or higher and 145° C. or lower from the viewpoint of imparting low-temperature and high-speed sealability. It is to be noted that the melting point of the B layer can be read as the peak temperature on the lowest temperature side, among endothermic peaks due to fusion, obtained when the B layer of the laminate is analyzed by differential scanning calorimetric analysis (DSC). Further, it is important for the B layer to contain a resin that is incompatible with the polypropylene-based resin from the viewpoint of imparting appropriate slipperiness without adding particles or a lubricant, and the B layer may contain various additives, for example, an antioxidant, a heat stabilizer, a chlorine scavenger, an antistatic agent, a filler, a viscosity modifier, a coloring inhibitor, and the like, as long as the object of the present invention is not impaired.

The method for laminating the B layer is not particularly limited, and examples thereof include extrusion lamination and dry lamination in addition to feedblock and multi-manifold methods by melt co-extrusion for film formation. From the viewpoint of production efficiency and cost, a method of laminating by melt co-extrusion is preferred. The thickness of the B layer of the polypropylene film is not to be considered particularly limited, but the lower limit is preferably 0.5%, more preferably 1%, based on the total thickness 100% of the polypropylene film. In contrast, the upper limit is preferably 80%, more preferably 60%, still more preferably 40%, particularly preferably 10%.

In a case where the polypropylene-based resin film has the C layer, the C layer may contain only a polypropylene-based resin as a constituent component, or may contain a resin other than the polypropylene-based resin. Examples of the resin other than the polypropylene-based resin include a cyclic olefin polymer (COP), a cyclic olefin copolymer (COC), an α-olefin-based elastomer, and a petroleum resin, and among these resins, the petroleum resin is particularly suitably employed. In the present specification, the petroleum resin is a petroleum resin having no polar group including a hydroxyl group, a carboxyl group, a halogen group, a sulfone group, a modified product thereof, or the like, and is specifically a resin made of, as a main raw material, a cyclopentadiene-based hydrocarbon made of a petroleum-based unsaturated hydrocarbon as a raw material, or a higher olefin-based hydrocarbon.

The layer C contains the petroleum resin, thereby enhancing the uniform stretchability in the formation of the polypropylene-based resin film, and thus allowing the stretching temperature in the longitudinal direction to be lowered, specifically, 120° C. or lower. Thus, the orientation degree and the heat resistance can be enhanced while reducing the surface roughness of the polypropylene-based resin film, and thus, the water vapor barrier property of the laminate according to embodiments of the present invention is easily improved. In addition, the petroleum resin has the effect of reducing the free volume of the amorphous part of the polypropylene-based resin to make water vapor less likely to diffuse, thus, also in that respect, allowing the water vapor barrier property of the laminate to be improved. In contrast, the excessive amount of the petroleum resin added may decrease the rigidity of the polypropylene-based resin film, thereby making pinholes and cracks more likely to be generated in the formation of the inorganic oxide layer by vapor deposition or the like, and damaging the water vapor barrier property of the laminate. From the viewpoint mentioned above, the content in the case of adding the petroleum resin to the C layer is preferably 3% by mass or more and 20% by mass or less, more preferably 3% by mass or more and 18% by mass or less, still more preferably 4% by mass or more and 17% by mass or less, particularly preferably 5% by mass or more and 16% by mass or less, based on all of the constituent components considered as 100% by mass. In addition, the softening point of the petroleum resin is preferably 90° C. or higher and 150° C. or lower, more preferably 100° C. or higher and 130° C. or lower. Such a range facilitates enhancing the uniform stretchability in the formation of the polypropylene-based resin film.

The laminate according to embodiments of the present invention achieves a balance between the excellent water vapor barrier property and the adhesion of the inorganic oxide layer, and also has high heat resistance, and thus can be suitably used for a packaging material. The object to be packaged in the laminate according to embodiments of the present invention is not particularly limited, and examples thereof include objects that are likely to deteriorated by water vapor, such as food, medicine, cosmetics, and fresh flowers.

Hereinafter, the polypropylene-based resin composition (hereinafter, which may be referred to simply as a resin composition) of the whole polypropylene-based resin film constituting the laminate according to the present invention will be described.

The upper limit of the molecular weight distribution Mz/Mw of the polypropylene-based resin component constituting the resin composition is preferably 4.5, more preferably 4.0, still more preferably 3.5. The lower limit of Mz/Mw is substantially about 1.5. When Mz/Mw is 4.5 or less, the amount of the high-molecular-weight component relaxed when heat is applied to the polypropylene-based resin film is small, thus facilitating the control of the tan δ of the laminate at 145° C. to 0.25 or less. For setting the molecular weight distribution Mz/Mw of the resin composition to have the value mentioned above, a method of adjusting the hydrogen gas concentration at the time of polymerization of the polypropylene-based resin as a raw material, a method of appropriately selecting a catalyst and/or a cocatalyst, and the composition, a method of performing a peroxide treatment, a method of blending multiple polypropylene-based resin raw materials in appropriate proportions, or the like is preferably employed.

The resin composition preferably has a differential distribution value of 1.0% or more and 10% or less at the logarithmic molecular weight Log (M) of 6.5 in a molecular weight distribution curve measured by gel permeation chromatography. The upper limit is more preferably 8.0% or less, still more preferably 6.0% or less. The differential distribution value of 1.0% or more at the logarithmic molecular weight Log (M) of 6.5 results in sufficient high-molecular-weight components to serve as tie molecules to enhance the uniform stretchability at the time of stretching the polypropylene-based resin film. In contrast, the differential distribution value of 10% or less at the logarithmic molecular weight Log (M) of 6.5 results in, for the laminate produced from the polypropylene-based resin film, no excessive molecular chains that are relaxed when heat is applied, thereby suppressing an increase in thermal shrinkage stress particularly in a high-temperature range in excess of 121° C.

In addition, the melt flow rate (MFR) of the polypropylene-based resin component constituting the resin composition preferably falls within the range of 2.0 g/10 min or more and 20 g/10 min or less (230° C., 21.18 N load) from the viewpoints of film formability and film strength. The lower limit of the MFR is more preferably 2.5 g/10 min, still more preferably 3.0 g/10 min. The upper limit thereof is more preferably 10 g/10 min. For setting the MFR of the resin composition to have the value mentioned above, a method of controlling the average molecular weight or molecular weight distribution of the polypropylene-based resin as a raw material, or the like is employed. More specifically, preferably employed is a method of adjusting the hydrogen gas concentration at the time of polymerization, a method of appropriately selecting a catalyst and/or a co-catalyst, and the composition to control the molecular weight and molecular weight distribution of the polypropylene-based resin, a method of performing a peroxide treatment, or the like. Reducing the high-molecular-weight components increases the MFR.

In embodiments of the present invention, the surface layer of the polypropylene-based resin film on the side in contact with the inorganic oxide layer preferably includes substantially no particles. The inorganic oxide layer is formed by a vapor phase film formation method such as vapor deposition, and when the surface of the film to be formed is rough, pinholes and cracks are generated in the inorganic oxide layer, thereby causing the barrier property to be decreased. Accordingly, for keeping the surface in contact with the inorganic oxide layer smooth, it is preferable to include substantially no particles. Including no particles also reduces variations in the barrier property due to the presence or absence of particles, which is preferred. It is to be noted that the surface layer includes substantially no particles refers to the fact that the surface layer does not contain inorganic or organic particles such as alumina, silica, a crosslinked silicone, and a crosslinked polymethyl methacrylate, in excess of 300 nm (preferably 200 nm or more) in average particle diameter in an amount of 1% by mass or more, more preferably 0.5% by mass or more, still more preferably 0.3% by mass or more, particularly preferably 0.2% by mass or more based on the 100% by mass of whole resin of the A layer.

In embodiments of the present invention, the surface of the polypropylene-based resin film provided with the inorganic oxide layer preferably has 30 atomic % or more carbon atoms, 40 atomic % or less oxygen atoms, and 25 atomic % or less metal atoms analyzed and then detected by X-ray photoelectron spectroscopy (XPS). When the inorganic oxide layer is peeled off for measuring the peel strength in embodiments of the present invention, the polypropylene-based resin film in the vicinity of the interface of the inorganic oxide layer adheres to the surface (hereinafter, which may be referred to as an α surface) of the inorganic oxide layer in contact with the polypropylene-based resin film, and thus, the α surface can be analyzed by XPS in the depth direction to know the condition of the surface of the polypropylene-based resin film. The surface of the polypropylene-based resin film is considered located at a position at which the amount of carbon is ½ of the maximum value on a depth-atomic ratio profile obtained by depth analysis of the surface (α surface) of the inorganic oxide layer, subjected to the measurement of the peel strength, in contact with the polypropylene-based resin film by XPS with the use of the conditions described in Examples. When the polypropylene-based resin film does not have the above-mentioned anchor layer on the surface, the surface layer on the side in contact with the inorganic oxide layer contains the polypropylene-based resin as a main component, and thus has very few polar groups. When the inorganic oxide is laminated directly on such a surface, the small interaction between the inorganic oxide layer and the polypropylene-based resin film reduces the peel strength of the inorganic oxide layer.

Examples of the method for increasing the peel strength include, as one thereof, a method of modifying the surface of the polypropylene-based resin film in contact with the inorganic oxide layer to introduce a functional group and increase the polarity, but when the polypropylene-based resin is excessively oxidized at the time of introducing the functional group, the polypropylene-based resin is deteriorated and more likely to cause a cohesive failure. Accordingly, for increasing the peel strength, it is important to appropriately adjust the quantity of functional groups introduced into the surface of the polypropylene-based resin film. It is to be noted that when the polypropylene-based resin film has an anchor layer on the surface, the quantity of functional groups may be appropriately adjusted without any surface modification in some cases.

The carbon atoms detected by analyzing the α surface by XPS are preferably 30 atomic % or more, more preferably 40 atomic % or more, still more preferably 45 atomic % or more. The oxygen atoms are preferably 40 atomic % or less, more preferably 35 atomic % or less. The metal atoms are preferably 25 atomic % or less, more preferably 20 atomic % or less. The fact that the carbon atoms, the oxygen atoms, and the metal atoms are respectively 30 atomic % or more, 40 atomic % or less, 25 atomic % or less means that the cohesive failure due to the excessive modification is suppressed in the surface layer of the polypropylene-based resin film, which is effective for increasing the peel strength of the inorganic oxide layer. Further, the upper limit of the amount of the carbon atoms is substantially 95 atomic %, the lower limit of the oxygen atoms is substantially 3 atomic %, and the lower limit of the metal atoms is substantially 1 atomic %.

The laminate according to embodiments of the present invention may have a topcoat layer on the inorganic oxide layer. The topcoat layer is a layer containing an organic compound or an organic-inorganic mixture laminated on the surface of the inorganic oxide layer on the side opposite to the polypropylene-based resin film, and is a layer that does not satisfy the above-described requirements for the inorganic oxide layer. The laminate has the topcoat layer, thereby allowing the expectation of the effect of improving the oxygen barrier property, which is not likely to be sufficiently achieved by only the inorganic oxide layer, and also allowing the expectation of the effect of protecting the inorganic oxide layer to keep the water vapor barrier property and the oxygen barrier property from being deteriorated at the time of bag-making processing or conveyance.

Preferred examples of the topcoat layer containing an organic-inorganic mixture include, as one thereof, a mixture of: an alkoxide containing a metal or a silicon atom and/or a polycondensate thereof; and a water-soluble polymer. The alkoxide containing a metal or a silicon atom for use in the top coat is represented by the general formula "M (OR) n". In the general formula, n represents a natural number, M represents a metal atom (for example, Ti, Al, or the like) or a silicon atom (Si), and R represents an alkyl group (in particular, a lower alkyl group having 1 to 4 carbon atoms is preferred). For the alkoxide containing a metal or a silicon atom, for example, tetramethoxysilane, tetraethoxysilane, tetrapropoxysilane, and tetrabutoxysilane can be suitably used from the viewpoints of reactivity, stability, and cost, and these may be used alone, or as a mixture of two or more thereof. The alkoxide containing a metal or a silicon atom may be hydrolyzed or polycondensated for forming a network.

Examples of the water-soluble polymer for use in the top coat include a vinyl alcohol-based resin, polyvinyl pyrrolidone, starch, and a cellulose-based resin, and among these examples, the vinyl alcohol-based resin with an excellent gas barrier property is preferred. Examples of the vinyl alcohol-based resin include a polyvinyl alcohol, an ethylene-vinyl alcohol copolymer, and a modified polyvinyl alcohol, and these resins may be used alone, or as a mixture of two or more thereof. The vinyl alcohol-based resin is typically obtained by saponifying a polyvinyl acetate, a copolymer thereof, or the like, and may be partially saponified by saponifying some of acetic acid groups or completely saponified, but the degree of saponification is preferably higher.

The mixing ratio of the alkoxide containing a metal or a silicon atom to the water-soluble polymer in the topcoat layer is preferably water-soluble polymer/metal alkoxide=15/85 to 85/15 in the ratio by mass based on the alkoxide containing a metal or a silicon atom in terms of $SiO_2$. It is to be noted that the ratio by mass in terms of $SiO_2$ is obtained by converting the number of moles of silicon atoms contained in the metal alkoxide into the mass of $SiO_2$, and is represented by water-soluble polymer/alkoxide containing metal or silicon atom (ratio by mass).

The thickness of the topcoat layer is preferably 200 nm or more and 600 nm or less, more preferably 350 nm or more and 500 nm or less. When the thickness of the topcoat layer is 200 nm or more, pinholes and cracks in the inorganic oxide layer can be sufficiently filled, and an excellent oxygen barrier function is exhibited. In contrast, the thickness of the topcoat layer is 600 nm or less, thereby allowing cracks due to the thickness and the oxygen barrier property deteriorated due to insufficient curing to be reduced.

Hereinafter, a method for producing the laminate according to embodiments of the present invention will be described with reference to specific examples, but the laminate according to embodiments of the present invention is not limited to that obtained by the production method.

First, a method for producing the polypropylene-based resin film constituting the laminate according to embodiments of the present invention will be described. In the production of the polypropylene-based resin film, first, a molten polypropylene-based resin or polypropylene-based resin composition is melt-extruded onto a support to obtain an unstretched polypropylene film. Subsequently, this unstretched polypropylene film is stretched in the longitudinal direction and then stretched in the width direction to be sequentially biaxially stretched. Thereafter, the film is subjected to a heat treatment and a relaxation treatment to produce a biaxially oriented polypropylene film. Hereinafter, the method will be described more specifically, but the polypropylene-based resin film constituting the laminate according to embodiments of the present invention and the production method therefor are not necessarily interpreted to be limited thereto.

First, in the case of employing a single-layer configuration for the polypropylene-based resin film, a polypropylene-based resin (single or mixture) as a raw material is melt-extruded from a single-screw extruder set at an extrusion temperature of 220° C. to 280° C., preferably 230° C. to 270° C., and passed through a filtration filter to remove foreign matters and the like. Subsequently, the molten resin is extruded from a slit-shaped spinneret at a temperature of 200° C. to 260° C., more preferably 210° C. to 240° C.

In contrast, in the case of employing a laminated configuration of two or more layers for the polypropylene-based resin film, polypropylene-based resins (single or mixture for each of the resins) as raw materials for the respective layers are melt-extruded from separate single-screw extruders set at an extrusion temperature of 220° C. to 280° C., preferably 230° C. to 270° C., and passed through a filtration filter to remove foreign matters and the like, and then, these molten resins are joined by a feedblock or the like so as to provide a desired layer configuration (for example, in the case of three layers, a layer/c layer/b layer where the a layer, the b layer, and the c layer are respectively an unstretched A layer, an unstretched B layer, and an unstretched C layer). Subsequently, the joined resin is extruded from a slit-shaped spinneret at a temperature of 200° C. to 260° C., more preferably 210° C. to 240° C. Further, in the extrusion of two or more layers, it is preferable not to use components other than the polypropylene-based resin, such as an ethylene-vinyl alcohol copolymer, a polyvinylidene chloride, and nylon. Such a configuration allows foreign matters such as a gelled product at the time of recycling to be suppressed to improve the recyclability of the laminate.

In each case of the single-layer configuration and composite configuration, the resin is sufficiently melted to reduce the molecular chain scission due to shearing by screw rotation at the time of melt extrusion, thereby facilitating the control the tan δ of the main orientation axis direction at 145° C. to 0.25 or less while the structure of the polypropylene-based resin film is not relaxed even at high temperatures. In contrast, lowering the temperature of the molten resin immediately before discharge from the spinneret can reduce the spherulite size in the unstretched film in the casting step, thereby facilitating the control of the surface roughness of the polypropylene-based resin film stretched, and furthermore, the surface roughness (St value and Sku value) of the laminate for smaller values. Thus, temperature setting capable of achieving multi-stage temperature lowering is preferred such that: the temperature before the filtration filter is a high temperature; the temperature after the filtration filter is a passing through the filtration filter is a temperature that is lower than the temperature before the filtration filter; and the spinneret temperature immediately before discharge is further lowered.

Next, the molten resin sheet extruded from the slit-shaped spinneret is cooled for solidification on a casting drum (cooling drum) with a surface temperature controlled to 10° C. to 40° C. to obtain an unstretched polypropylene film. As a method for bringing the molten resin sheet into close contact with the casting drum, any of approaches such as an electrostatic application method, a method with the use of the surface tension of water, an air knife method, a press roll method, an underwater casting method, and an air chamber method may be used, or multiple methods may be combined, and preferred is an air knife method capable of improving the film flatness and controlling the surface roughness. In addition, in the case of using the air knife method, it is preferable to appropriately adjust the position of the air knife such that the air flows to the downstream side of the film formation for keeping the film from vibrating.

From the viewpoint of smoothing the surface of the obtained polypropylene film for improving the thickness uniformity and adhesion of the inorganic oxide layer formed by the vapor deposition or the like, the surface temperature of the casting drum is preferably 10° C. to 30° C., more preferably 10° C. to 27° C., most preferably 10° C. to 25° C. Such a temperature range makes it possible to increase the mesomorphic phase fraction of a surface layer part particularly on the drum surface side (the side on which the inorganic oxide layer is formed) of the unstretched polypropylene film, such that the unstretched polypropylene film has a mesomorphic phase structure.

The mesomorphic phase is an intermediate phase between a crystal and an amorphous phase, and is a phase specifically produced in solidification at a very high cooling rate from a molten state. Spherulites are generally known to grow by crystallization when a polypropylene-based resin is cooled for solidification, and stretching an unstretched polypropylene film with such spherulites produced is believed to produce a difference in stretching stress, for example, between the crystal and amorphous parts inside the spherulites and between the spherulites, and generate local stretching unevenness, thereby leading to thickness unevenness and structure unevenness. In contrast, the mesomorphic phase has no spherulite form, thus generating no stretching unevenness. Thus, when the mesomorphic structure is formed, the stretching uniformity is enhanced, thereby allowing the thickness in the case of a film to be more uniformly controlled, and allowing the surface roughness to be more uniformly controlled to be smaller. In addition, when the unstretched film has no spherulite structure, the temperature in stretching (longitudinal stretching) in the longitudinal direction can be made lower than that of the unstretched propylene film with spherulites.

Next, the unstretched polypropylene film is biaxially stretched to be biaxially oriented. First, the unstretched polypropylene film is preheated by passing the film between rolls with the lower limit preferably kept at 70° C., more preferably 80° C., and the upper limit preferably kept at 140° C., more preferably 130° C., still more preferably 120° C. Subsequently, the unstretched polypropylene film kept in the temperature range with the lower limit preferably kept at 70° C., more preferably 80° C., and the upper limit preferably kept at 140° C., more preferably 130° C., still more preferably 120° C. is longitudinally stretched at a stretching ratio of 2.0 times or more and 15 times or less, preferably 4.0 times or more and 10 times or less, more preferably 4.5 times or more and 8.0 times or less, still more preferably 4.5 times or more and 6.0 times or less in the longitudinal direction. Then, the obtained film is cooled by passing the film between rolls with the lower limit preferably kept at 50° C., more preferably 60° C., and the upper limit preferably kept at 90° C., more preferably 80° C., and then, the film is subjected to a heating relaxation treatment in the longitudinal direction. More specifically, the film is passed between rolls with the lower limit preferably kept at 70° C., more preferably 80° C., and the upper limit preferably kept at 140° C., more preferably 130° C., subjected to a relaxation treatment with the lower limit of preferably 1.0%, more preferably 2.0%, still more preferably 3.0%, particularly preferably 4.0%, and upper limit of preferably 15%, more preferably 13%, still more preferably 12%, particularly preferably 10% with the use of a difference in roll circumferential speed, and then cooled to room temperature to obtain a uniaxially oriented film. Applying such a relaxation treatment allows the distortion of some of the molecular chains with a weak binding force to be removed while leaving the molecular chain strongly oriented in the longitudinal direction by longitudinal stretching. As a result, it is easy for the polypropylene-based resin film biaxially stretched to have a structure with less distortion of molecular chains that causes heat shrinkage both in the longitudinal direction and the width direction, thereby facilitating the control of the tan δ of the main orientation axis direction at 145° C. to 0.25 or less. As a result, in providing the inorganic oxide layer on the polypropylene-based resin film by vapor deposition or the like, defects such as pinholes and cracks can be kept from being generated in the inorganic oxide layer to improve the water vapor barrier property of the laminate.

In addition, in the case of providing an anchor layer on the surface layer of the polypropylene-based resin film according to embodiments of the present invention on the side in contact with the inorganic oxide layer, as a method therefor, a method of applying, to the uniaxially oriented film, a coating composition with an aqueous solvent used, and drying and heat-treating the coating composition in the subsequent step, that is, an in-line coating method is preferably employed. Using such a method can not only simplify the production process for the laminate to reduce the production cost, but also, because the applied layer is then stretched in the film width direction, facilitate the control of the thickness of the finally obtained anchor layer to 200 nm or less, thereby easily improving the recyclability of the laminate.

Subsequently, the uniaxially oriented film is guided to a tenter with opposite ends of the film in the width direction being grasped with clips, and stretched in the width direction (laterally stretched) with the opposite ends of the film being grasped with the clips. The temperature (stretching temperature in the width direction) in the case is 155 to 175° C., preferably 162 to 172° C. In addition, the stretching ratio in the width direction is preferably 8.0 times or more and 20.0 times or less, more preferably 8.5 times or more and 16.0 times or less, still more preferably 9.0 times or more and 12.0 times or less. The stretching ratio in the width direction is set to be 8.0 times or more, thereby allowing high orientation to be imparted in the width direction as well while maintaining the high orientation state in the longitudinal direction to increase the molecular chain tension in the surface. Thus, particularly in the use of the film in packaging applications, the structural stability of the film against heat at the time of vapor deposition can be enhanced to form a uniform vapor-deposited film, thereby the water vapor barrier property and the oxygen barrier property to be improved. In addition, the stretching ratio in the width direction is set to be 20.0 times or less, thereby allowing film breakages at the time of film formation to be prevented to improve the productivity.

In addition, in the production of the propylene-based resin film, an area stretching ratio is preferably set to be 40 times or more and 100 times or less. The area stretching ratio is obtained by multiplying the stretching ratio in the longitudinal direction by the stretching ratio in the width direction. The lower limit of the area stretching ratio is more preferably 45 times, still more preferably 50 times.

In the production of the polypropylene-based resin film, a heat treatment and a relaxation treatment are preferably performed after the lateral stretching. Specifically, the heat treatment is performed at a temperature of 140° C. or higher and 167° C. or lower while relaxing the film by 2% or more and 20% or less in the width direction with the opposite ends in the width direction being tightly grasped with the clips of the tenter. The heat treatment temperature is more preferably 150° C. or higher, still more preferably 155° C. or higher, particularly preferably 161° C. or higher. The heat treatment temperature is set to be 140° C. or higher or in the preferred range mentioned above, thereby allowing the structural stability of the polypropylene-based resin film against heat to be improved, and allowing the phenomenon (thermal damage phenomenon) of generating defects such as pinholes and cracks in the inorganic oxide layer to be suppressed when the inorganic oxide layer is formed by vapor deposition or the like to form a laminate. As a result, the water vapor barrier property and oxygen barrier property of the laminate can be improved. In addition, the heat treatment temperature is more preferably 166° C. or lower, still more preferably 165° C. or lower. The heat treatment temperature is set to be 167° C. or lower or in the preferred range described above, thereby allowing the flatness of the polypropylene-based resin film to be improved, and allowing the St value and Sku value of the laminate to be reduced.

In the relaxation treatment, from the viewpoint of enhancing the structural stability of the film against heat, the lower limit of the relax ratio is preferably set to be 2%, more preferably 5%, still more preferably 7%, particularly preferably 9%. In addition, the upper limit thereof is preferably set to be 20%, more preferably 18%, still more preferably 178, particularly preferably 15%. The relax ratio is 2% or more, thereby facilitating the thermal shrinkage rate stress measured by thermomechanical analysis (TMA) to meet $SF_{145°\ C.}-SF_{121°\ C.} \leq 2.50$ MPa. In contrast, the relax ratio is 20% or less, thereby keeping the film from being relaxed inside the tenter, and as a result, the film formed is less likely to have wrinkles generated, and furthermore, also reduced in deterioration of mechanical characteristics and unevenness at the time of vapor deposition.

Thereafter, with the opposite ends in the width direction remaining tensely gripped with the clips, the film is guided to the outside of the tenter through a cooling step at 100 to 145° C., and the clips at the opposite ends in the width direction are released. Through such a cooling step, distortions in the film, which could not be completely removed by the heat treatment, are removed to suppress thermal shrinkages at high temperatures, thus allowing the water vapor barrier property of the laminate according to embodiments of the present invention to be further improved.

After the cooling step mentioned above, the film is guided to the outside of the tenter, the clips at the opposite ends in the width direction of the film are then released under a room temperature atmosphere, and the opposite edges in the width direction of the film are slit in a winder step. Thereafter, for the purpose of increasing the peel strength of the inorganic oxide layer, the surface on which the inorganic oxide layer is to be laminated (typically, the surface on the side in contact with the cast drum) is preferably subjected to an in-line surface modification treatment. Examples of the in-line surface modification treatment include a corona discharge treatment, or a plasma treatment, an ion beam treatment, or the like, in the air or in an atmosphere gas of oxygen, nitrogen, hydrogen, argon, a carbon dioxide gas, a silane gas, or a mixture thereof. In particular, as for the corona discharge treatment, it is effective to perform the treatment in an atmosphere gas with an oxygen concentration of 10% or less, preferably 5% or less, more preferably 1% or less, and as a specific aspect of the atmosphere gas with an oxygen concentration of 1% or less, it is effective to employ, in particular, a nitrogen gas, a carbon dioxide gas, or a mixture thereof. In addition, a method of combining the corona discharge treatment in the above-described atmosphere gas with the plasma treatment or the ion beam treatment is also effective. Performing the treatment in such an atmosphere allows a hydrophilic functional group to be efficiently introduced while inhibiting the generation of a low-molecular-weight product due to polypropylene molecular chain scission at the film surface, thus facilitating the increased peel strength of the inorganic oxide layer.

The film thus obtained can be wound into a roll form to obtain a polypropylene-based resin film constituting the laminate according to embodiments of the present invention. Further, in the case of a configuration where the anchor layer is provided on the polypropylene-based resin film, it is also possible to provide the anchor layer on the surface layer by off-line coating separately after winding the polypropylene-based resin film once into a roll form. As described above, however, from the viewpoints of production cost and layer thickness, it is more preferable to employ an in-line coating method as a method for providing the anchor layer.

Subsequently, a method for laminating the inorganic oxide layer on the surface of the polypropylene-based resin film to form a laminate will be described. It is to be noted that the polypropylene-based resin film herein may be a polypropylene-based resin film obtained by the method described above or a polypropylene-based resin film obtained by the above-described step excluding the in-line surface modification treatment. More specifically, the surface modification treatment is performed twice in the former case, whereas the surface modification treatment is performed once in the latter case.

The inorganic oxide layer according to embodiments of the present invention can be produced by a vapor phase film formation method. For forming the inorganic oxide layer, for example, known methods such as a vacuum vapor deposition method, a sputtering method, an ion plating method, or a plasma vapor deposition method (CVD) can be used, and in particular, it is preferable to use a vacuum vapor deposition method from the viewpoint of being capable of forming a film at high speed with high productivity. Examples of the method for evaporating an inorganic oxide raw material by a vacuum vapor deposition method include, but are not limited thereto, an electron beam (EB) vapor deposition method, a resistance heating method, and an induction heating method. Examples of the method for obtaining the inorganic oxide include a method of directly evaporating an oxide, and a method of adjusting the evaporation amount of the inorganic substance by the method mentioned above and then introducing oxygen into the evaporation gas to obtain an inorganic oxide layer that has a controlled amount of oxygen and film quality controlled. As long as the gas to be introduced contains oxygen, an inert gas or the like may be contained as another gas for film quality control. In the case of obtaining an aluminum oxide layer as an example, examples of the method therefor include a method of evaporating aluminum and introducing oxygen. In the case of introducing an oxygen-containing gas to form the inorganic oxide layer, it is preferable to introduce oxygen from immediately above the evaporation source. The phrase "directly above the evaporation source" refers to an oxygen gas introduction pipe located on a straight line connecting the evaporation source and the center of the main drum. When oxygen is introduced while being diffused in the direction from the location toward the main drum, the metal vapor and oxygen are easily mixed, and a uniformly a stably oxidized film can be obtained, and thus, the film quality of the entire inorganic oxide layer is improved to improve the barrier property. The main roll for vapor deposition is preferably cooled for preventing thermal damage to the film, and the temperature thereof is preferably 20° C. or lower, more preferably 0° C. or lower.

In this case, for improving the peel strength between the polypropylene-based resin film and the inorganic oxide layer immediately before forming the inorganic oxide layer on the surface of the polypropylene-based resin film, it is preferable to further perform an off-line surface modification treatment separately from the in-line surface modification treatment performed in the film formation step for the polypropylene-based resin film described above. Examples of the off-line surface modification treatment include a corona treatment, a plasma treatment, and an ion beam treatment under a specific gas atmosphere. The surface modification treatment for the polypropylene-based resin film can be performed under the atmospheric pressure or under a vacuum atmosphere, but when the surface modification treatment is performed in a vacuum atmosphere, moisture adhering to the film surface can be removed, and low-molecular-weight components produced by the surface modification treatment can be kept from re-adhering. Furthermore, surface contaminations are suppressed by performing the surface modification treatment immediately before the vapor deposition, and continuously performing the vapor deposition without being opened to the atmosphere, and the active species produced on the film surface react, thereby allowing strong adhesion of the vapor-deposited layer to be achieved. For the gas in the surface modification treatment, argon, nitrogen, helium, neon, oxygen, a carbon dioxide gas, hydrogen, ammonia, hydrocarbon ($C_nH_{2n+2}$, where n is an integer of 1 to 4), and the like can be used alone or in combination. The gas for use in the surface modification treatment can be selected appropriately depending on the ease of discharge, the energy of active species obtained, and the type of the functional group desired to be introduced, but it is preferable to contain, for introducing the functional group, a carbon dioxide gas or an oxygen gas, and argon or nitrogen, which is likely to be stably discharged.

In embodiments of the present invention, examples of particularly preferred surface modification treatment before the vapor deposition include an ion beam treatment. The ion beam treatment is an approach of treating a film surface by extracting charged particles from plasma generated at an electrode and irradiating the film surface with the charged particles. The ion beam treatment is preferred in that appropriate conditions can be selected depending on the base material in terms of broad range of adjusting the voltage and the current as described later. In embodiments of the present invention, for uniformly performing the treatment particularly in the film width direction, it is preferable to use an anode layer-type ion source that has an electrode structure linearly elongated. The anode layer-type ion source has a configuration including, on the front surface of the ion source, a circumferential or racetrack-shaped gap, and including, inside the ion source, a magnet for forming a magnetic field in the gap of a slit and an anode capable of applying a high voltage, and the anode layer-type ion source is an ion source that forms a magnetic field in the gap width direction, and additionally applies, to the anode disposed on the back surface of an opening, a voltage that is positive with respect to the gap (cathode) to enhance plasma and accelerate ions due to the hole motion of electrons caused by the gap magnetic field. When the electrode is linearly elongated and disposed such that the longitudinal direction is perpendicular to the film conveyance direction, the entire film can be uniformly treated, which is preferred.

The degree of vacuum in the chamber at the time of ion beam treatment of the polypropylene-based resin film is preferably $1\times10^{-5}$ Pa or more and $5\times10^{-2}$ Pa or less. The degree of vacuum is set to be $1\times10^{-5}$ Pa or more, thereby allowing stable discharge to be achieved, and the degree of vacuum is set to be $5\times10^{-2}$ Pa or less, thereby allowing the ion beam to be prevented from diffusing to obtain a sufficient treatment effect. For the gas for use in the treatment, argon, nitrogen, helium, neon, oxygen, a carbon dioxide gas, hydrogen, ammonia, hydrocarbon ($C_nH_{2n+2}$, where n is an integer of 1 to 4), and the like can be used alone or in combination, but argon, nitrogen, helium, oxygen, and a carbon dioxide gas are preferred from the viewpoint of stable availability, and nitrogen, oxygen, and carbon dioxide gas are more preferred from the viewpoints of easily providing functional groups that contribute to adhesion and having a wide range of stable discharge.

For the ion beam treatment, the treatment intensity can be adjusted with the voltage and the current at the time of discharge. The input voltage for the ion beam treatment is preferably 0.5 kV or higher and 3.0 kV or lower, more preferably 0.7 kV or higher and 2.5 kV or lower. The input voltage is set to be 0.5 kV or higher, thereby stabilizing the discharge, whereas the input voltage is set to be 3.0 kV or lower, thereby allowing damage to the film surface due to excessive treatment intensity to be reduced.

The current value for the ion beam treatment indicates the quantity of active species in the treatment atmosphere, and the large current value will increase the number of particles that trigger the initiation of the reaction. More specifically, to adjust the current value is to adjust the amount of the reaction initiation site. The current value per treatment area for the ion beam treatment is preferably 30 mA·sec/m² or more and 1500 mA·sec/m² or less, more preferably 50 mA·sec/m² or more and 600 mA·sec/m² or less. The current value per treatment area is a value obtained by dividing the current value in the treatment by the electrode width and the conveyance speed of the film. When the current value is large, that is, when the number of active species is large, many active species act on the molecular chains, and the reaction is initiated at many sites. The current value is to be 30 mA·sec/m² or more, thereby allowing the number of functional groups that contribute to adhesion to be increased, whereas the current value is set to be 1500 mA·sec/m² or less, thereby allowing the amount of the reaction initiation to be limited to keep the film from being damaged and keep the surface layer from being then weakened.

After the inorganic oxide layer is laminated on the polypropylene-based resin film layer, a topcoat layer can be further formed. As a method (method) for coating the inorganic oxide layer with the topcoat layer, known method such as a direct gravure method, a reverse gravure method, a micro gravure method, a rod coating method, a bar coating method, a die coating method, and a spray coating method can be used without particular limitation. When the topcoat layer contains an organic-inorganic mixture, the metal alkoxide contained in the layer undergoes, with heat, a polycondensation reaction to form a strong film, thereby allowing the barrier property to be improved. Accordingly, for further promoting the reaction of the organic-inorganic mixture layer, the obtained laminate can be further heat-treated.

EXAMPLES

Hereinafter, embodiments of the present invention will be described in more detail with reference to examples, but the present invention is not limited to the following aspects. It is to be noted that respective items were evaluated by the following method.
[Methods for Measuring Characteristic Values, Methods for Evaluating Effects]
Methods for measuring characteristic values and methods for evaluating effects in embodiments of the present invention are as follows.
(1) Water Vapor Transmission Rate
The laminate according to embodiments of the present invention was measured under the conditions of a temperature of 40° C. and a humidity of 90% RH set such that water vapor was allowed to transmit from the surface of the laminate with no inorganic oxide laminated thereon with the use of a water vapor transmission rate measuring apparatus "PERMATRAN-W" (registered trademark) 3/31 manufactured by MOCON/Modern Controls Inc., in accordance with the method B of JIS K 7129-2 (2019). The measurement was performed twice for two test pieces, and the average value of the four measurement values obtained was calculated and regarded as the water vapor transmission rate of the sample (unit: g/m²/day).
(2) Oxygen Transmission Rate
For the laminate according to embodiments of the present invention, the oxygen transmission rate was measured under the conditions of a temperature of 23° C. and a humidity of 90% RH set such that oxygen was allowed to transmit from the surface of the laminate with no inorganic oxide laminated thereon with the use of an oxygen transmission rate measuring apparatus "OXTRAN" (registered trademark) 2/20 manufactured by MOCON/Modern Controls Inc., in accordance with the isobaric method of JIS K 7126-2 (2006). The measurement was performed twice for two test pieces, and the average value of the four measurement values obtained was calculated and regarded as the oxygen transmission rate of the sample (unit: cc/m²/day).
(3) Peel Strength of Inorganic Oxide Layer
A polypropylene film of 20 μm in thickness (biaxially stretched polypropylene film FOR manufactured by Futamura Chemical Co., Ltd.) was laminated on the surface of the laminate on the side with the inorganic oxide layer laminated thereon or with the inorganic oxide layer and the topcoat layer laminated thereon. Adhesives DICDRY LX-500 (main agent for adhesive) and KW-75 (curing agent) manufactured by DIC Graphics Corporation, and an ethyl acetate solvent were mixed at 10:1:30 (ratio by weight) while stirring at room temperature, the mixture was applied to the vapor deposition surface of the laminate with a bar coater to have a thickness of 2 μm, and dried in a hot air oven set at 85° C. for 30 seconds, and then, the above-described polypropylene film was laminated thereon. The laminate body was aged at 40° C. for 48 hours, then cut into a width of 15 mm to obtain a sample, and the peel strength thereof was measured under the following apparatus and conditions. The sample was measured by bonding the vapor deposition base material side to a SUS plate with a thickness (1.5) mm with a double-sided tape (double-sided tape No. 532 manufactured by Nitto Denko Corporation, tape thickness: 0.08 mm), followed by fixing with an air chuck, fixing the bonded polypropylene film with another air chuck, and pulling the polypropylene film side. Further, the surface layer of the polypropylene-based resin film may adhere to the surface of the inorganic oxide layer in peeling, and even in that case, the inorganic oxide layer was considered peeled off, and the obtained measurement value was treated as the peel strength of the inorganic oxide layer.

Measuring apparatus: TENSILON Universal Material Testing Instrument RTG-1210 manufactured by A&D Company, Limited Load cell: 50N Peeling angle: 180° Peeling speed: 50 mm/min Measurement environment: room temperature 23° C., humidity 50%

(4) Thickness of Laminate

The thickness of the laminate (the laminate of the inorganic oxide layer provided on or of the inorganic oxide layer and topcoat layer provided on the polypropylene-based resin film) according to embodiments of the present invention was measured at arbitrary 10 sites in an atmosphere of 23° C. and 65% RH with the use of a contact-type electronic micrometer (type K-312A) manufactured by ANRITSU CORPORATION. The arithmetic average value of the thicknesses at the 10 sites was regarded as the thickness (unit: μm) of the laminate. It is to be noted that the accuracy (unit: μm) of the thickness obtained by this measurement method is up to the first decimal place, and the thickness of the inorganic oxide layer was measured separately by the method of (5).

(5) Thickness of Inorganic Oxide Layer

The thickness of the inorganic oxide layer constituting the laminate according to embodiments of the present invention was measured by cross-sectional observation with a transmission electron microscope (TEM). A sample for the cross-sectional observation was prepared by an FIB method with the use of Microsampling System (FB-2000A, manufactured by Hitachi, Ltd.) (specifically, according to the method described in "Kobunshi Hyomen Kakogaku" (Polymer Surface Processing), Satoru Iwamori, pp. 118-119. Subsequently, a cross section of the sample for observation was observed with a transmission electron microscope (H-9000UHRII, manufactured by Hitachi, Ltd.) at an accelerating voltage of 300 kV, and the thickness of the inorganic oxide layer was checked at arbitrary 10 sites. The arithmetic average value of the thicknesses was regarded as the thickness (unit: nm) of the inorganic oxide layer.

(6) $SF_{145° C.}-SF_{121° C.}$

<Method for Determining Main Orientation Axis of Laminate>

First, a method for determining the main orientation axis of the laminate will be described. The laminate was prepared, and cut into a rectangle of 50 mm in length and 10 mm in width with an arbitrary direction as a long side to obtain a sample <1>. In this case, the direction in which the long side of the rectangular sample <1> was directed was defined as 0°. Next, a sample <2> in the same size was collected such that the long side direction was directed in a direction rotated rightward by 15° from the 0° direction.

Subsequently, samples <3> to <12> were collected in the same manner by similarly rotating the long side direction of the rectangular sample by 15° each. Next, each of the rectangular samples was set in a tensile tester ("Tensilon" (registered trademark) UCT-100 manufactured by ORIENTEC CORPORATION) at an initial chuck-to-chuck distance of 20 mm such that the long side direction is a tensile direction, and a tensile test was performed at a tensile speed of 300 mm/min under an atmosphere at room temperature. In this case, the maximum load until a sample breakage was read, and the value obtained by dividing the maximum load by the cross-sectional area (film thickness×width) of the sample before the test was calculated as the stress of the maximum point strength. The same measurement was performed five times for each of the samples to obtain the average value for the stress of the maximum point strength, and the long side direction of the sample with the largest average value was defined as the main orientation axis of the laminate, whereas the direction orthogonal thereto was defined as the direction orthogonal to the main orientation axis of the laminate.

<Measurement of Thermal Shrinkage Stress by Thermomechanical Analysis (TMA)>

The laminate was cut into a rectangular sample of 4 mm in width and 50 mm in length with the "main orientation axis direction" defined as described above as a long side, and the sample was pinched by a metal chuck so as to have a test length of 20 mm. Thereafter, the sample was set in the following thermomechanical analyzer, and a thermal shrinkage curve in the main orientation axis direction in the laminate with the test length kept constant was obtained under the following temperature conditions and load conditions.

(Apparatus)

Apparatus: TMA/SS 6000 (manufactured by Seiko Instruments Inc.)

(Temperature Conditions)

Temperature range: 23 to 200° C.

Heating rate: 10° C./min

Hold: 10 minutes

Sampling time: (10 sec/procedure)

Nitrogen cooling: No (Load Conditions)

Control mode: L

Upper limit displacement during standby: 0 μm

Initial displacement: 0 μm

Load rate: 0.1 μm/min

Hold: 600 minutes

Measurement atmosphere: In nitrogen

Measurement thickness: The laminate thickness in (4) mentioned above was used.

<Calculation of $SF_{145° C.}-SF_{121° C.}$>

From the thermal shrinkage stress curve obtained by the measurement method described above, each of the following numerical values was read while the shrinkage stress value at the temperature closest to 25° C. was corrected as a zero point, and $SF_{145° C.}-SF_{121° C.}$ was calculated.

$SF_{145° C.}$: Thermal shrinkage stress (MPa) at 145° C. in main orientation axis direction of laminate $SF_{121° C.}$: Thermal shrinkage stress (MPa) at 121° C. in main orientation axis direction of laminate (7) Tan δ of Main Orientation Axis Direction at 145° C.

A test piece (5 mm in width×20 mm in length) cut out with the main orientation axis direction of the laminate, determined in (6), as a measurement direction and the measurement direction as a long side was attached to an apparatus chuck part under an atmosphere at 23° C., cooled down to a low temperature of −100° C., and tan δ was measured until the temperature reached 180° C. from −100° C. after the start of temperature rise. A viscoelasticity-temperature curve was drawn by a dynamic viscoelasticity method, and the tan δ at each temperature was calculated. The test was performed with n=3, and the average value of the values obtained was regarded as tan δ in the measurement direction. Further, the measurement apparatus and conditions are as follows.

Apparatus: Rheogel-E4000 (manufactured by UBM)

Geometry: tensile

Distance between chucks: 10 mm

Frequency: 10 Hz

Strain: 0.1 to 0.2%

Temperature range: −100 to 180° C.

Heating rate: 5° C./min

Measurement atmosphere: In nitrogen (8) St Value and Sku Value of Surface of Inorganic Oxide Layer The measurement of the St value and Sku value was performed with the use of a scanning white-light interference microscope VS1540 from Hitachi High-Tech Science Corporation, which is a three-dimensional non-contact surface profile measuring instrument. In addition, in analysis, with the use of attached analysis software, the undulation component was removed from a shot image by polynomial fourth-order approximation surface correction, then, the image was processed with a median (3×3) filter, and then subjected to interpolation processing (processing of compensating for pixels from which height data failed to be acquired, with height data calculated from surrounding pixels). The measurement conditions were as follows.

Manufacturer: Hitachi High-Tech Science Corporation

Apparatus name: Scanning white-light interference microscope VS1540

Measurement conditions: Objective lens 10×

Lens barrel 1×

Zoom lens 1×

Wavelength filter 530 nm white

Measurement mode: Wave

Measurement software: VS-Measure Version 10.0.4.0

Analysis software: VS-Viewer Version 10.0.3.0

Measurement area: 0.561×0.561 mm².

(9) F5(x)/F5(y)

Rectangular samples (width (short side): 10 mm×length (long side): 150 mm) cut out with the test length directions (main orientation axis direction defined in (6) and the direction orthogonal to the main orientation axis) of the laminate as the long side direction were each used as a measurement sample. Next, the sample was set in a sample tensile tester ("Tensilon" (registered trademark) UCT-100 manufactured by ORIENTEC CORPORATION) at an initial chuck-to-chuck distance of 20 mm, and a tensile test of the sample was performed under an environment of room temperature at a tensile speed of 300 mm/min. In this case, the position of the sample in the long side direction was adjusted such that the center of the sample was located in the vicinity of the center between the chucks. In addition, the load applied at a sample elongation of 5% was read, and the value obtained by dividing the load by the cross-sectional area (film thickness×width (10 mm)) of the sample before the test was calculated as stress at 5% elongation (F5 value, unit: MPa). The measurement was performed five times for each direction, and F5(x)/F5(y) was calculated, with F5(x) and F5(y) being respectively the F5 value in the main orientation axis direction and the F5 value in the direction orthogonal to the main orientation axis as the arithmetic average values of the measurements.

(10) Differential Distribution Value at Logarithmic Molecular Weight Log (M)=6.5 and Molecular Weight Distribution Mz/Mw of Polypropylene-Based Resin or Polypropylene Resin Film As a sample, a polypropylene-based resin for use in the polypropylene-based resin film constituting the laminate according to embodiments of the present invention, or only a polypropylene-based resin component (excluding a non-polypropylene component such as a petroleum resin) further extracted from only the polypropylene-based resin film obtained by peeling off the part of the inorganic oxide layer or of the inorganic oxide layer and topcoat layer from the laminate according to embodiments of the present invention was used. The sample was dissolved by stirring at 165° C. for 30 minutes with 1,2,4-trichlorobenzene as a solvent. Thereafter, the solution was heated and filtered with the use of a sintered filter with a pore size of 0.5 µm, the molecular weight distribution of the sample component contained in the filtrate was measured with the following apparatus and under the following conditions, and the differential distribution value at the logarithmic molecular weight Log (M) of 6.5 was then read. In addition, the molecular weight distribution Mz/Mw was calculated by determining the weight average molecular weight Mw and the Z average molecular weight Mz of a sample by using a molecular weight calibration curve prepared with the use of the following standard sample and excluding a component with a molecular weight of 5000 or less.

Apparatus: High-temperature GPC device PL-GPC220 manufactured by Agilent Technologies, Inc.

Detector: Differential refractive index detector (RI detector) manufactured by Agilent Technologies, Inc.

Column: PL1110-6200 (20 µm MIXED-A)×2, manufactured by Agilent Technologies, Inc.

Flow rate: 1.0 mL/min

Column temperature: 140° C.

Injection amount: 0.300 mL

Sample concentration: 1 mg/mL

Standard sample: Monodisperse polystyrene manufactured by Tosoh Corporation, dibenzyl manufactured by Tokyo Chemical Industry Co., Ltd.

(11) Melting Point and Melting Enthalpy ΔHm of Resin Composition of Surface Layer of Polypropylene-Based Resin Film As a sample, a raw material resin composition (resin composition obtained by mixing multiple raw materials in predetermined proportions in the case of the raw materials mixed) for use in the surface layer (A layer) of the polypropylene-based resin film constituting the laminate according to embodiments of the present invention, or a polypropylene-based resin composition cut from the surface layer (A layer) of the polypropylene-based resin film obtained by peeling off the inorganic oxide layer or peeling off the inorganic oxide layer and the topcoat layer from the laminate was used. With the use of a differential scanning calorimeter (EXSTAR DSC6220 manufactured by Seiko Instruments Inc.), 3 mg of the sample was heated from 30° C. to 260° C. at a heating rate of 20° C./min in a nitrogen atmosphere. Subsequently, the sample was held at 260° C. for 5 minutes, and then cooled down to 30° C. under the condition of 20° C./min. The sample was further held at 30° C. for 5 minutes, and then heated again from 30° C. to 260° C. under the condition of 20° C./min. The peak temperature of the endothermic curve obtained at the time of heating the sample again was defined as the melting point of the resin composition of the surface layer. In a case where multiple peak temperatures can be observed, the highest temperature was defined as the melting point of the resin composition of the surface layer. In addition, the melting enthalpy $\Delta Hm$ (J/g) was read from the endothermic peak of the curve in the temperature range of 100° C. or higher and 180° C. or lower.

(12) Observation of Layer of Polypropylene-Based Resin Film in Contact with Inorganic Oxide Layer For the presence of particles in the layer of the polypropylene-based resin film in contact with the inorganic oxide layer, the laminate was cut in the thickness direction with a microtome, and the cross section of the laminate was observed with a Schottky field emission scanning electron microscope JSM-7600 F manufactured by JEOL Ltd. In the cross-section cutting, 25 points were cut out in parallel with the main orientation axis, whereas 25 points were cut out in a direction orthogonal to the main orientation axis, each of the points was observed at a magnification of 20,000 times, and a case where a particle of 200 nm or more in diameter was present was determined as the presence of a particle, whereas a case where no particle of 200 nm or more in diameter was present was determined as the absence of a particle.

(13) Composition of Surface of Polypropylene-Based Resin Film Provided with Inorganic Oxide Layer The surface ($\alpha$ surface) of the inorganic oxide layer with the peel strength measured in the section (3), in contact with the polypropylene-based resin film, was subjected to depth analysis by XPS with the use of the apparatus and conditions listed below to obtain a profile of element ratio to the depth. On the obtained profile, the position at which the amount of carbon was $\frac{1}{2}$ of the maximum value was defined as the surface of the polypropylene-based resin film provided with the inorganic oxide layer, and the atomic ratio was determined.

Apparatus: XPS spectrometer K-Alpha$^+$ manufactured by Thermo Fisher Scientific K.K.

Excited X-rays: monochromatic Al $K\alpha_{1,2}$ rays (1486.6 eV)

X-ray diameter: 400 $\mu$m

Photoelectron take-off angle: 90° (inclination of the detector with respect to the sample surface)

Ion etching conditions: Ar gas cluster ion (Ar-GCIB)

Ion etching rate: 11.3 nm/min (polypropylene equivalent, see J. Vac. Sci. Technol. A 31 (2), 020605, 2013)

Smoothing of data: 11-point smoothing

Abscissa correction of data: The C1s main peak (CHx, C—C) was set to be 284.6 eV.

(14) Heat Sealability

On the surface of the laminate on the side opposite to the inorganic oxide layer, a biaxially oriented polypropylene film manufactured by Toray Industries, Inc. "TORAYFAN" (registered trade mark) #30-2500H was stacked on one another, and heat-sealed with the use of a flat heat sealer under the following conditions to prepare a bonded product. Thereafter, the interface between the laminate according to embodiments of the present invention and the stretched PET film was subjected to a T-peel test with the use of "Tensilon" (registered trademark) manufactured by ORIENTEC CORPORATION to measure the heat seal strength. Further, the bonded product in the peeling test was sampled in a strip shape of 20 mm in width×150 mm in length, and the heat seal strength was measured at a tensile speed of 300 mm/min. This measurement was performed three times, and the average value of the obtained values was regarded as the heat seal strength (N/25.4 mm). It was determined that the heat sealability was determined as pass (A) when the heat-seal strength could achieve 2 N/25.4 mm or more, whereas it was determined that the heat sealability was determined as failure (C) when the heat-seal strength was less than 2 N/25.4 mm.

Heat Sealing Condition

Pressing Pressure: 0.4 N/mm$^2$

Pressing time: 1 sec

Heater temperature: 120° C.

(15) Recyclability

First, the inorganic oxide layer, or the inorganic oxide layer and the topcoat layer were peeled off and then removed from the laminate by the method described in (3). Subsequently, the remaining part on the polypropylene-based resin film side was finely cut, and a sample of 1 g in total weight was collected. The obtained sample was put in a petri dish on a hot plate heated to 260° C., then melted for 10 minutes, sufficiently stirred, then taken out, and cooled to room temperature. Subsequently, the cooled sample was sandwiched between two metal plates, put in a pressing machine heated to 240° C., then preheated for 1 minute, and then pressed at a pressure of 60 kgf/cm$^2$ to obtain a thin film sheet of 100 $\mu$m in thickness. The appearance of the obtained thin film sheet was visually checked, and the recyclability was determined in accordance with the following criteria (A was regarded as a pass).

A: The entire thin film sample was uniform, with no foreign matter observed.

C: In the thin film sample, a foreign matter was observed

(16) Dimensional Stability of Laminate in Long-Term Storage

The laminate according to embodiments of the present invention was wound up as a roll of 300 mm in width, and stored for 7 days under an environment at a temperature of 40° C. and a humidity of 90% RH, and thereafter, the appearance of the roll was visually checked, and evaluated in accordance with the following criteria.

A: No wrinkles (winding tightness) were observed on the roll.

B: One or more and ten or less wrinkles (winding tightness) were observed on the roll.

C: Eleven or more wrinkles (winding tightness) were observed on the roll.

Components for Use in Production of Polypropylene Films According to Examples and Comparative Examples The following components were used for the production of polypropylene-based resin films constituting laminates according to Examples and Comparative examples.

(Polypropylene-Based Resin for a Layer)

A1: Ethylene-propylene copolymer (ethylene content 1.0%, melting point: 158° C., MFR=3.0 g/min, differential distribution value at Log (M)=6.5: 3.9, Mz/Mw: 3.4)

A2: Homopolypropylene-based resin (melting point: 164° C., MFR=4.0 g/10 min, differential distribution value at Log (M)=6.5: 3.8, Mz/Mw: 3.1)

A3: Homopolypropylene-based resin (melting point: 166° C., MFR=3.0 g/10 min, differential distribution value at Log (M)=6.5: 4.0, Mz/Mw: 3.3)

A4: Homopolypropylene-based resin (melting point: 167° C., MFR=3.5 g/min, differential distribution value at Log (M)=6.5: 8.2, Mz/Mw: 4.2)

A5: Homopolypropylene-based resin (melting point: 166° C., MFR=4.0 g/10 min, differential distribution value at Log (M)=6.5: 10.6, Mz/Mw: 4.7)

A6: Homopolypropylene-based resin (melting point: 161° C., MFR=2.3 g/10 min, differential distribution value at Log (M)=6.5: 13.2, Mz/Mw: 5.5)

A7: High melt strength propylene resin (MFR=3.0 g/min, differential distribution value at Log (M)=6.5: 13.0, Mz/Mw: 5.3)

(Master Batch for a Layer and Resin Other than Polypropylene-Based Resin)

Polymethylpentene-based resin A: "TPX" (registered trademark) (RT31, melting point 235° C., MFR: 21 g/10 min @260° C.) manufactured by Mitsui Chemicals, Inc.

AM1: Masterbatch prepared by kneading and extruding A1 (90 parts by mass), polymethylpentene-based resin A (10 parts by mass), and an antioxidant (0.1 parts by mass) with an extruder set at 260° C., then cooling the strand with water, and forming the strand into chips.

(Polypropylene-Based Resin for B Layer)

B1: Homopolypropylene-based resin (melting point: 164° C., MFR=3.0 g/10 min, differential distribution value at Log (M)=6.5: 3.7, Mz/Mw: 3.2)

B2: Ethylene-propylene random copolymer (melting point: 130° C., MFR: 3.0 g/min).

(Master Batch for B Layer and Resin Other than Polypropylene-Based Resin)

Polymethylpentene-based resin B: "TPX" (registered trademark) (DX845, melting point 232° C., MFR: 9 g/10 min @260° C.) manufactured by Mitsui Chemicals, Inc.

BM1: Masterbatch prepared by kneading and extruding B1 (90 parts by mass), polymethylpentene-based resin B (10 parts by mass), and an antioxidant (0.1 parts by mass) with an extruder set at 260° C., then cooling the strand with water, and forming the strand into chips.

(Master Batch for C Layer and Resin Other than Polypropylene-Based Resin)

C1: Homopolypropylene-based resin (melting point: 167° C., MFR=3.0 g/10 min, differential distribution value at Log (M)=6.5: 6.8, Mz/Mw: 3.6)

C2: Homopolypropylene-based resin (melting point: 164° C., MFR=4.0 g/10 min, differential distribution value at Log (M)=6.5: 1.0, Mz/Mw: 2.6)

(Petroleum Resin and Master Batch)

Petroleum resin 1: T-REZ HA125 (manufactured by JXTG Energy Corporation, softening point 125° C.)

Petroleum resin 2: Tg: 80° C., bromine number: 3 cg/g, hydrogenation ratio: 99% of polydicyclopentadiene CM1: Masterbatch prepared by kneading and extruding C1 (70 parts by mass), petroleum resin 1 (30 parts by mass), and an antioxidant (0.1 parts by mass) with an extruder set at 240° C., then cooling the strand with water, and forming the strand into chips (Particles, Additives, Etc.)

P1: Silica particles of 400 nm in average particle diameter

P2: Silica particles of 300 nm in average particle diameter

P3: Crosslinked particles of a polymethacrylic acid-based polymer of 2 μm in average particle diameter

Example 1

As a polypropylene-based resin raw material for the A layer, a mixture of A1 and A2 at a ratio by mass of 70:30 was used. In addition, as a raw material for the B layer (heat seal layer), a mixture of B1 and BM1 at a ratio by mass of 80:20 was used. Furthermore, as a raw material for the C layer, a mixture of C1, C2, and CM1 at a ratio by mass of 50:25:25 was used. The raw materials for the respective layers were supplied to an extruder (A), an extruder (B), and an extruder (C), which were separate single-screw extruders, to perform melt extrusion at 260° C., foreign matters were removed with an 80 μm cut sintered filter, and then, the resin was passed through a pipe set at 250° C. Thereafter, the amount of extrusion was adjusted such that the lamination ratio was 1/13/1 in three-layer lamination of a/c/b (a layer for unstretched A layer, c layer for unstretched C layer, and b layer for unstretched layer B) with the use of a feedblock, and the molten laminated polymer was discharged from a T-shaped slit die set at 240° C. Thereafter, the discharged molten sheet was cooled for solidification in close contact on a casting drum held at 20° C. with an air knife to obtain an unstretched film.

Next, the unstretched polypropylene film was preheated to 105° C. in a stepwise manner with a plurality of roll groups, passed between rolls with a difference in circumferential speed as it was, and stretched 5.0 times in the longitudinal direction. Subsequently, the stretched film was cooled by being passed between rolls held at 70° C., then passed again between the rolls held at 90° C., subjected to a 5.0% relaxation treatment with the use of a difference in roll circumferential speed, and then cooled to room temperature to obtain a uniaxially oriented film.

Furthermore, the obtained uniaxially oriented film was guided to a tenter, stretched 10.5 times in the width direction at 170° C. with the opposite ends in the film width direction being grasped with clips, and then heat-treated at 165° C. while being relaxed by 10% in the width direction. Thereafter, with the opposite ends in the width direction remaining tensely gripped with the clips, the film was guided to the outside of the tenter through a cooling step at 140° C., and the clips at the opposite ends in the film width direction were released. Next, the film surface (the side in contact with the casting drum) was subjected to a corona discharge treatment at a treatment intensity of 25 W·min/m² under a mixed gas atmosphere in which a carbon dioxide gas and a nitrogen gas were mixed at a ratio by volume of 15:85 (oxygen concentration: 0.8% by volume), and the obtained biaxially oriented polypropylene film was then wound up as a roll.

Subsequently, the above-mentioned biaxially oriented polypropylene film was subjected to an ion beam treatment, and subsequent to the treatment, an aluminum oxide layer was provided by an electron beam vapor deposition method. For the ion beam treatment, a surface treatment was performed with the use of a linear anode layer-type ion source operated under an oxygen atmosphere at $2.5 \times 10^{-3}$ Pa, an anode voltage of 2.5 kV, and a current value per treatment area of 63 mA·sec/m². For the formation of the inorganic oxide layer, while blowing an oxygen gas from a gas introduction pipe with the use of aluminum as a vapor deposition material, the input power and the current were adjusted to obtain an aluminum oxide layer of 7 nm in thickness.

Furthermore, a topcoat layer was laminated as follows. For the topcoat layer, a coating liquid prepared in accordance with the following procedure was applied by the method described below so as to have a thickness of 350 nm. A polyvinyl alcohol (hereinafter, which may be abbreviated as PVA, polymerization degree: 1,700, saponification degree: 98.5%) was put into a solvent with a ratio by mass of water/isopropyl alcohol=97/3, and heated and stirred at 90° C. to obtain a polyvinyl alcohol solution with a solid content of 10% by mass. In addition, 13.3 g of a 0.02 N aqueous hydrochloric acid solution was added dropwise to a solution obtained by mixing 8.4 g of tetraethoxysilane and 3.3 g of methanol while stirring to obtain a tetraethoxysilane solution. Further, 5.0 g of a 0.06 N aqueous hydrochloric acid solution was added dropwise to a solution obtained by mixing 8.0 g of ethyl silicate 48 manufactured by COL-COAT CO., LTD. and 12.0 g of methanol while stirring to obtain an ethyl silicate solution. The tetraethoxysilane solution and the ethyl silicate solution were mixed such that the solid content weight in terms of $SiO_2$ was 60/40, thereby providing an inorganic component solution. Thereafter, the polyvinyl alcohol solution and the inorganic component solution were mixed and stirred such that the solid content of the PVA and the solid content weight ratio of the inorganic component solution in terms of $SiO_2$ was 65/35, and diluted with water to obtain a coating liquid with a solid content of 12%. The obtained coating liquid was applied onto the inorganic compound layer and dried at 110° C. to obtain a laminate. The properties of the obtained laminate are shown in Table 1-1.

Example 2

A laminate was obtained in the same manner as in Example 1, except that the topcoat layer was not laminated and that the temperature of the casting drum was 18° C. The properties of the obtained laminate are shown in Table 1-1.

Examples 3 to 6, 9, 10

Laminates were obtained in the same manner as in Example 2 except that the raw materials and film formation conditions for the polypropylene-based resin film were changed as shown in Table 1. The properties of the obtained laminate are shown in Table 1-1.

Example 7

A laminate was obtained in the same manner as in Example 2, except that the raw materials and film formation conditions for the polypropylene-based resin film were changed as shown in Table 1, and instead of performing the corona discharge treatment and the ion beam treatment before laminating the aluminum oxide layer, an undercoat layer was laminated on the surface of the A layer in accordance with the following procedure. The properties of the obtained laminate are shown in Table 1-1.

<Lamination of Undercoat Layer>

The following mixed coating agent was applied to the A layer of the biaxially oriented polypropylene film wound as a roll with an off-line gravure coater, and then subjected to hot-air drying at 110° C. for 30 seconds to laminate an undercoat layer with a thickness of 700 nm.

<Mixed Coating Agent>

To 100 parts by mass of "HYDRAN" (registered trademark) AP-201 (manufactured by DIC Corporation, solid content concentration: 23% by mass) as a polyester urethane-based water-dispersible resin, 6 parts by mass of a melamine compound "AMIDIR" (registered trademark) APM (manufactured by DIC Corporation) as a crosslinking agent was added, and 1 part by mass of "CATALYST" PTS (manufactured by DIC Corporation) as a water-soluble acidic compound as a crosslinking catalyst was further added. Subsequently, pure water was added to adjust such that the total solid content concentration was 10% by mass, thereby providing a mixed coating agent.

Example 8

A4 was used as a polypropylene-based resin raw material. This raw material was supplied to a single-screw extruder set at 260° C. and then melted, passed through a pipe set at 260° C. after removing foreign matters with an 80 μm cut sintered filter, and discharged from a T-shaped slit die set at 260° C. Thereafter, the discharged molten sheet was cooled for solidification in close contact on a casting drum held at 32° C. with an air knife to obtain an unstretched sheet. Then, a laminate was obtained in the same manner as in Example 2, except that the film formation conditions were changed as shown in Table 1. The properties of the obtained laminate are shown in Table 1-1.

Comparative Example 1

A5 was used as a polypropylene-based resin raw material. This raw material was melt-extruded at 250° C., passed through a pipe set at 250° C. after removing foreign matters with an 80 μm cut sintered filter, and discharged from a T-shaped slit die set at 250° C. Thereafter, the discharged molten sheet was cooled for solidification in close contact on a casting drum held at 30° C. with an air knife to obtain an unstretched film.

Next, the unstretched polypropylene film was preheated to 135° C. in a stepwise manner with a plurality of roll groups, passed between rolls with a difference in circumferential speed as it was, and stretched 4.5 times in the longitudinal direction to obtain a uniaxially oriented film. Furthermore, the obtained uniaxially oriented film was guided to a tenter, stretched 8.2 times in the width direction at 160° C. with the opposite ends in the film width direction being grasped with clips, and then heat-treated at 168° C. while being relaxed by 6.7% in the width direction. Thereafter, the film was guided to the outside of the tenter, and the clips at the opposite ends in the film width direction were released. Next, the film surface (on the side of the surface in contact with the casting drum) was subjected to a corona discharge treatment at a treatment intensity of 25 W·min/m² in the air, and the obtained biaxially oriented polypropylene film was then wound up as a roll.

Subsequently, with the use of $Al_2O_3$ (purity: 99.5%) and $SiO_2$ (purity: 99.9%) in the form of particles from about 3 to 5 mm as vapor deposition sources, the $Al_2O_3$ and $SiO_2$ were simultaneously vapor-deposited on the above-mentioned polypropylene-based resin film by an electron beam vapor deposition method to form an $Al_2O_3$—$SiO_2$-based thin film layer. For the vapor deposition materials, a circular crucible of 40 mm in diameter was divided into two parts by a carbon plate, and the granular $Al_2O_3$ and the granular $SiO_2$ were put respectively into the parts without being mixed. With the use of one electron gun as a heating source, each of the $Al_2O_3$ and $SiO_2$ was heated by irradiation with an electron beam in a time-division manner, and the heated and vaporized $Al_2O_3$ and $SiO_2$ were mixed and then deposited on the surface of the polypropylene-based resin film. The emission current of the electron gun at the time was 205 mA, the acceleration voltage was 6 kV, and the aluminum oxide put into the crucible was charged with power corresponding to 160 mA×6 kV, whereas the silicon oxide was charged with power corresponding to 45 mA×6 kV. The vacuum pressure at the time of vapor deposition was set to be 1.1×10⁻⁴ Pa, and the temperature of the roll supporting the film was set to be 23° C. The thin film layer was vapor-deposited so as to have a thickness of 20 nm by changing the film formation rate to obtain a laminate. The properties of the obtained laminate are shown in Table 1-2.

Comparative Example 2

A mixture of A6, A7 and petroleum resins 2 and P3 at a ratio by mass of 92:5:3:0.15 was supplied to a twin-screw extruder, extruded into a string shape at 270° C., cooled through a water tank at 20° C., cut into a length of 3 mm with a chip cutter, and dried at 100° C. for 2 hours to obtain chips. A laminate was obtained in the same manner as in Example 2, except that these chips were used as a raw material and that the film formation conditions were changed as shown in Table 1. The properties of the obtained laminate are shown in Table 1-2.

Comparative Examples 3 and 4

Laminates were obtained in the same manner as in Example 2, except that the surface treatment before the AlOx vapor deposition was only a corona discharge treatment in the air and that the raw materials and film formation conditions for the polypropylene-based resin film were changed as shown in Table 1. The properties of the obtained laminate are shown in Table 1-2.

TABLE 1-1

|  |  |  | Example 1 | Example 2 | Example 3 | Example 4 |
|---|---|---|---|---|---|---|
| Raw materials and film formation conditions for polypropylene resin film | Configuration | — | A/C/B | A/C/B | A/C/B | A/C/B |
|  | Lamination ratio | — | 1/13/1 | 1/13/1 | 1/13/1 | 1/13/1 |
|  | Raw material for A layer | Ratio by mass | A1/A2 = 70/30 | A1/A2 = 70/30 | A1/A2/P1 = 70/30/0.2 | A1/A2 = 80/20 |
|  | Raw material for B layer | Ratio by mass | B1/BM1 = 80/20 | B1/BM1 = 80/20 | B1/BM1 = 80/20 | B1/BM1 = 80/20 |
|  | Raw material for C layer | Ratio by mass | C1/C2/CM1 = 50/25/25 | C1/C2/CM1 = 50/25/25 | C1/C2/CM1 = 50/25/25 | C1/C2/CM1 = 50/25/25 |
|  | Extrusion temperature | ° C. | 260 | 260 | 260 | 260 |
|  | Pipe temperature of extruder to spinneret | ° C. | 250 | 250 | 250 |  |
|  | Spinneret temperature | ° C. | 240 | 240 | 240 |  |
|  | Casting drum temperature | ° C. | 20 | 18 | 18 | 28 |
|  | Stretching temperature of longitudinal stretching | ° C. | 105 | 105 | 105 | 107 |
|  | Stretching ratio of longitudinal stretching | times | 5.0 | 5.0 | 5.0 | 5.1 |
|  | Temperature of relaxation treatment of longitudinal stretching | ° C. | 90 | 90 | 90 | 90 |
|  | Relaxation treatment of longitudinal stretching | % | 5.0 | 5.0 | 5.0 | 5.0 |
|  | Stretching ratio of lateral stretching | times | 10.5 | 10.5 | 10.4 | 10.1 |
|  | Stretching temperature of lateral stretching | ° C. | 170 | 170 | 170 | 170 |
|  | Heat treatment temperature of lateral stretching | ° C. | 165 | 165 | 165 | 158 |
|  | Relaxation treatment of lateral stretching | % | 10 | 10 | 10 | 8 |
|  | Cooling temperature after relaxation treatment | ° C. | 140 | 140 | 140 | 140 |
| Undercoat layer, surface treatment, inorganic oxide layer, and topcoat layer | Presence or absence of undercoat layer | — | No | No | Yes | No |
|  | Corona treatment | — | In mixed gas | In mixed gas | In mixed gas | In mixed gas |
|  | Ion beam treatment | — | Yes | Yes | Yes | Yes |
|  | Type of inorganic oxide layer | — | AlOx | AlOx | AlOx | AlOx |
|  | Thickness of inorganic oxide layer | nm | 7 | 7 | 7 | 8 |
|  | Presence or absence of topcoat layer | — | Yes | No | No | No |
| Properties of resin composition | Melting point of resin composition of surface layer | ° C. | 161 | 161 | 161 | 160 |
|  | Melting enthalpy ΔHm of resin composition of surface layer | J/g | 90 | 90 | 90 | 93 |
|  | Mz/Mw | — | 3.2 | 3.2 | 3.2 | 3.4 |
|  | Differential distribution value at log (M) of 6.5 | % | 4.1 | 4.1 | 4.1 | 3.9 |
| Properties of laminate | Thickness of laminate | μm | 15.4 | 15.0 | 15.1 | 15.2 |
|  | $SF_{145° C.}$ | MPa | 1.37 | 1.49 | 1.47 | 1.45 |
|  | $SF_{121° C.}$ | MPa | 0.04 | 0.03 | 0.03 | 0.03 |
|  | $SF_{145° C.}$-$SF_{121° C.}$ | MPa | 1.33 | 1.46 | 1.44 | 1.42 |
|  | tanδ of main orientation axis direction at 145° C. | — | 0.18 | 0.17 | 0.17 | 0.20 |
|  | Presence or absence of particles in layer in contact with inorganic oxide layer | — | No | No | Yes | No |
|  | St value | nm | 161 | 146 | 720 | 433 |
|  | Sku value | — | 3.1 | 2.9 | 90 | 4.0 |
|  | F5 (x) | MPa | 95 | 96 | 95 | 90 |
|  | F5 (y) | MPa | 43 | 44 | 44 | 46 |
|  | F5 (x)/F5 (y) | — | 2.2 | 2.2 | 2.2 | 2.0 |
|  | Carbon atomic weight of polypropylene resin-based film surface | atomic % | 53 | 52 | 52 | 48 |
|  | Oxygen atomic weight of polypropylene resin-based film surface | atomic % | 30 | 31 | 31 | 33 |
|  | Metal atomic weight of polypropylene resin-based film surface | atomic % | 17 | 17 | 17 | 19 |
|  | Water vapor transmission rate | g/m²/day | 1.0 | 1.0 | 2.8 | 1.4 |
|  | oxygen transmission rate | cc/m²/day | 0.2 | 38 | 90 | 55 |
|  | Peel strength of inorganic oxide layer | N/15 mm | 1.5 | 1.5 | 1.5 | 1.4 |

TABLE 1-1-continued

| | | | | | | |
|---|---|---|---|---|---|---|
| Heat sealability | — | | C | C | C | C |
| Recyclability | — | | A | A | A | A |
| Dimensional stability in long-term storage | — | | A | A | A | A |

| | | | Example 5 | Example 6 | Example 7 | Example 8 |
|---|---|---|---|---|---|---|
| Raw materials and film formation conditions for polypropylene resin film | Configuration | — | A/C/B | A/C/B | A/C/B | Single layer |
| | Lamination ratio | — | 2/11/2 | 1/13/1 | 1/13/1 | — |
| | Raw material for A layer | Ratio by mass | A3 | A3/P2 = 100/0.15 | A1/A2 = 80/20 | A4 |
| | Raw material for B layer | Ratio by mass | B2/BM1 = 80/20 | B1 | B1/BM1 = 80/20 | — |
| | Raw material for C layer | Ratio by mass | C1/C2/CM1 = 65/10/25 | C1/C2/CM1 = 50/25/25 | C1/C2/CM1 = 50/25/25 | — |
| | Extrusion temperature | °C. | 260 | 260 | 260 | 260 |
| | Pipe temperature of extruder to spinneret | °C. | | | | |
| | Spinneret temperature | °C. | | | | |
| | Casting drum temperature | °C. | 30 | 30 | 28 | 32 |
| | Stretching temperature of longitudinal stretching | °C. | 110 | 108 | 104 | 130 |
| | Stretching ratio of longitudinal stretching | times | 5.2 | 4.9 | 5.1 | 4.8 |
| | Temperature of relaxation treatment of longitudinal stretching | °C. | 75 | No | 90 | No |
| | Relaxation treatment of longitudinal stretching | % | 3.0 | No | 5.0 | No |
| | Stretching ratio of lateral stretching | times | 9.5 | 10 | 10.2 | 8.0 |
| | Stretching temperature of lateral stretching | °C. | 170 | 170 | 170 | 170 |
| | Heat treatment temperature of lateral stretching | °C. | 153 | 153 | 158 | 147 |
| | Relaxation treatment of lateral stretching | % | 7 | 3 | 8 | 8 |
| | Cooling temperature after relaxation treatment | °C. | 130 | No | 140 | 130 |
| Undercoat layer, surface treatment, inorganic oxide layer, and topcoat layer | Presence or absence of undercoat layer | — | No | No | Yes | No |
| | Corona treatment | — | In mixed gas | In mixed gas | No | In mixed gas |
| | Ion beam treatment | — | Yes | Yes | No | Yes |
| | Type of inorganic oxide layer | — | AlOx | AlOx | AlOx | AlOx |
| | Thickness of inorganic oxide layer | nm | 8 | 8 | 7 | 6 |
| | Presence or absence of topcoat layer | — | No | No | No | No |
| Properties of resin composition | Melting point of resin composition of surface layer | °C. | 166 | 166 | 160 | 167 |
| | Melting enthalpy ΔHm of resin composition of surface layer | J/g | 106 | 106 | 93 | 108 |
| | Mz/Mw | — | 3.8 | 3.7 | 3.4 | 4.2 |
| | Differential distribution value at log (M) of 6.5 | % | 6.6 | 6.4 | 3.9 | 8.2 |
| Properties of laminate | Thickness of laminate | μm | 14.8 | 15.1 | 15.7 | 12.0 |
| | $SF_{145°\,C.}$ | MPa | 1.81 | 2.32 | 1.40 | 2.48 |
| | $SF_{121°\,C.}$ | MPa | 0.06 | 0.12 | 0.03 | 0.15 |
| | $SF_{145°\,C.}$-$SF_{121°\,C.}$ | MPa | 1.75 | 2.20 | 1.37 | 2.33 |
| | tanδ of main orientation axis direction at 145° C. | — | 0.22 | 0.24 | 0.20 | 0.24 |
| | Presence or absence of particles in layer in contact with inorganic oxide layer | — | No | Yes | No | No |
| | St value | nm | 420 | 680 | 408 | 550 |
| | Sku value | — | 4.0 | 60 | 3.5 | 120 |
| | F5 (x) | MPa | 89 | 88 | 90 | 83 |
| | F5 (y) | MPa | 46 | 45 | 45 | 45 |
| | F5 (x)/F5 (y) | — | 1.9 | 2.0 | 2.0 | 1.8 |
| | Carbon atomic weight of polypropylene resin-based film surface | atomic % | 42 | 40 | 47 | 39 |
| | Oxygen atomic weight of polypropylene resin-based film surface | atomic % | 36 | 39 | 34 | 37 |
| | Metal atomic weight of polypropylene resin-based film surface | atomic % | 22 | 20 | 19 | 24 |
| | Water vapor transmission rate | g/m²/ day | 1.8 | 2.5 | 1.4 | 2.8 |
| | Oxygen transmission rate | cc/m²/day | 70 | 75 | 57 | 80 |
| | Peel strength of inorganic oxide layer | N/15 mm | 1.0 | 1.1 | 1.4 | 0.8 |
| | Heat sealability | — | A | C | C | C |
| | Recyclability | — | A | A | A | A |
| | Dimensional stability in long-term storage | — | A | B | A | B |

| | | | Example 9 | Example 10 |
|---|---|---|---|---|
| Raw materials and film formation conditions for polypropylene resin film | Configuration | — | A/C/B | A/C/B |
| | Lamination ratio | — | 1/13/1 | 1/13/1 |
| | Raw material for A layer | Ratio by mass | A1/A2/AM1 = 40/30/30 | A1/A2/AM1 = 30/30/40 |
| | Raw material for B layer | Ratio by mass | B1/BM1 = 70/30 | B1 |

TABLE 1-1-continued

|  |  |  |  |  |
|---|---|---|---|---|
|  | Raw material for C layer | Ratio by mass | C1/C2/CM1 = 50/25/25 | C1/C2/CM1 = 50/25/25 |
|  | Extrusion temperature | ° C. | 260 | 260 |
|  | Pipe temperature of extruder to spinneret | ° C. | 250 | 250 |
|  | Spinneret temperature | ° C. | 240 | 240 |
|  | Casting drum temperature | ° C. | 19 | 20 |
|  | Stretching temperature of longitudinal stretching | ° C. | 105 | 135 |
|  | Stretching ratio of longitudinal stretching | times | 5.0 | 4.5 |
|  | Temperature of relaxation treatment of longitudinal stretching | ° C. | 90 | 85 |
|  | Relaxation treatment of longitudinal stretching | % | 5.5 | 5.0 |
|  | Stretching ratio of lateral stretching | times | 10.3 | 10.2 |
|  | Stretching temperature of lateral stretching | ° C. | 170 | 170 |
|  | Heat treatment temperature of lateral stretching | ° C. | 165 | 165 |
|  | Relaxation treatment of lateral stretching | % | 12 | 10 |
|  | Cooling temperature after relaxation treatment | ° C. | 140 | 140 |
| Undercoat layer, surface treatment, inorganic oxide layer, and topcoat layer | Presence or absence of undercoat layer | — | No | No |
|  | Corona treatment | — | In mixed gas | In mixed gas |
|  | Ion beam treatment | — | Yes | Yes |
|  | Type of inorganic oxide layer | — | AlOx | AlOx |
|  | Thickness of inorganic oxide layer | nm | 7 | 18 |
|  | Presence or absence of topcoat layer | — | No | No |
| Properties of resin composition | Melting point of resin composition of surface layer | ° C. | 161 | 161 |
|  | Melting enthalpy ΔHm of resin composition of surface layer | J/g | 90 | 90 |
|  | Mz/Mw | — | 3.2 | 3.2 |
|  | Differential distribution value at log (M) of 6.5 | % | 4.1 | 4.1 |
| Properties of laminate | Thickness of laminate | μm | 15.0 | 15.0 |
|  | $SF_{145° C.}$ | MPa | 1.49 | 1.85 |
|  | $SF_{121° C.}$ | MPa | 0.03 | 0.05 |
|  | $SF_{145° C.}$-$SF_{121° C.}$ | MPa | 1.46 | 1.8 |
|  | tanδ of main orientation axis direction at 145° C. | — | 0.17 | 0.19 |
|  | Presence or absence of particles in layer in contact with inorganic oxide layer | — | No | No |
|  | St value | nm | 355 | 390 |
|  | Sku value | — | 3.6 | 3.8 |
|  | F5 (x) | MPa | 96 | 93 |
|  | F5 (y) | MPa | 44 | 40 |
|  | F5 (x)/F5 (y) | — | 2.2 | 2.3 |
|  | Carbon atomic weight of polypropylene resin-based film surface | atomic % | 52 | 51 |
|  | Oxygen atomic weight of polypropylene resin-based film surface | atomic % | 31 | 32 |
|  | Metal atomic weight of polypropylene resin-based film surface | atomic % | 17 | 17 |
|  | Water vapor transmission rate | g/m²/day | 1.0 | 2.3 |
|  | Oxygen transmission rate | cc/m²/day | 37 | 51 |
|  | Peel strength of inorganic oxide layer | N/15 mm | 1.5 | 1.5 |
|  | Heat sealability | — | C | C |
|  | Recyclability | — | A | A |
|  | Dimensional stability in long-term storage | — | A | A |

TABLE 1-2

|  |  |  | Comparative Example 1 | Comparative Example 2 | Comparative Example 3 | Comparative Example 4 |
|---|---|---|---|---|---|---|
| Raw materials and film formation conditions for polypropylene resin film | Configuration | — | | Single layer | Single layer | A/C/B | A/C/B |
|  | Lamination ratio | — | | — | — | 1/13/1 | 1/13/1 |
|  | Raw material for A layer | Ratio by mass | A5 | A6/A7/ petroleum resin 2/P3 = 92/5/3/0.15 | A1/A2 = 80/20 | A1/A2/P3 = 80/20/0.15 |
|  | Raw material for B layer | Ratio by mass | — | — | B1/BM1 = 80/20 | B1 |
|  | Raw material for C layer | Ratio by mass | — | — | C1/C2/CM1 = 50/25/25 | C1/C2/CM1 = 50/25/25 |
|  | Extrusion temperature | ° C. | 250 | 270 | 260 | 260 |
|  | Pipe temperature of extruder to spinneret | ° C. | | | 250 | |
|  | Spinneret temperature | ° C. | | | 240 | |

TABLE 1-2-continued

| | | | Comparative Example 1 | Comparative Example 2 | Comparative Example 3 | Comparative Example 4 |
|---|---|---|---|---|---|---|
| | Casting drum temperature | ° C. | 30 | 35 | 20 | 20 |
| | Stretching temperature of longitudinal stretching | ° C. | 135 | 140 | 120 | 120 |
| | Stretching ratio of longitudinal stretching | times | 4.5 | 8.0 | 6.0 | 4.5 |
| | Temperature of relaxation treatment of longitudinal stretching | ° C. | No | No | No | 110 |
| | Relaxation treatment of longitudinal stretching | % | No | No | No | 6.5 |
| | Stretching ratio of lateral stretching | times | 8.2 | 8.0 | 10.5 | 8.0 |
| | Stretching temperature of lateral stretching | ° C. | 160 | 170 | 170 | 170 |
| | Heat treatment temperature of lateral stretching | ° C. | 168 | 160 | 153 | 155 |
| | Relaxation treatment of lateral stretching | % | 6.7 | 6 | 4 | 10 |
| | Cooling temperature after relaxation treatment | ° C. | No | 100 | No | 132 |
| Undercoat layer, surface treatment, inorganic oxide layer, and topcoat layer | Presence or absence of undercoat layer | | No | No | No | No |
| | Corona treatment | — | In air | In mixed gas | In air | In air |
| | Ion beam treatment | — | No | No | No | No |
| | Type of inorganic oxide layer | — | AlOx-SiOx | AlOx | AlOx | AlOx |
| | Thickness of inorganic oxide layer | nm | 20 | 45 | 15 | 7 |
| | Presence or absence of topcoat layer | — | No | No | No | No |
| Properties of resin composition | Melting point of resin composition of surface layer | ° C. | 166 | 160 | 161 | 161 |
| | Melting enthalpy $\Delta$Hm of resin composition of surface layer | J/g | 101 | 102 | 107 | 109 |
| | Mz /Mw | — | 4.7 | 5.4 | 3.3 | 3.1 |
| | Differential distribution value at log (M) of 6.5 | % | 10.6 | 13.1 | 3.9 | 3.9 |
| Properties of laminate | Thickness of laminate | μm | 20.0 | 15.0 | 19.6 | 16.5 |
| | $SF_{145° C.}$ | MPa | 3.10 | 2.74 | 2.97 | 1.93 |
| | $SE_{121° C.}$ | MPa | 0.25 | 0.22 | 0.20 | 0.13 |
| | $SF_{145° C.}$-$SF_{121° C.}$ | MPa | 2.85 | 2.52 | 2.77 | 1.80 |
| | tan$\delta$ of main orientation axis direction at 145° C. | — | 0.27 | 0.26 | 0.27 | 0.20 |
| | Presence or absence of particles in layer in contact with inorganic oxide layer | — | No | Yes | No | Yes |
| | St value | nm | 630 | 820 | 515 | 715 |
| | Sku value | — | 11.0 | 340 | 10.2 | 310 |
| | F5 (x) | MPa | 117 | 80 | 100 | 109 |
| | F5 (y) | MPa | 65 | 67 | 42 | 39 |
| | F5 (x)/F5 (y) | — | 1.8 | 1.2 | 2.4 | 2.8 |
| | Carbon atomic weight of polypropylene resin-based film surface | atomic % | 24 | 31 | 22 | 23 |
| | Oxygen atomic weight of polypropylene resin-based film surface | atomic % | 47 | 42 | 49 | 50 |
| | Metal atomic weight of polypropylene resin-based film surface | atomic % | 26 | 26 | 29 | 27 |
| | Water vapor transmission rate | g/m²/day | 3.3 | 4.4 | 3.5 | 3.8 |
| | Oxygen transmission rate | cc/m²/day | 9.4 | 80 | 54 | 65 |
| | Peel strength of inorganic oxide layer | N/15 mm | 0.4 | 0.7 | 0.1 | 0.1 |
| | Heat sealability | — | C | C | A | A |
| | Recyclability | — | A | A | A | A |
| | Dimensional stability in long-term storage | — | C | C | C | A |

In the tables, "in mixed gas" means under a mixed gas atmosphere (oxygen concentration: 0.8% by volume) in which a carbon dioxide gas and a nitrogen gas were mixed at a ratio by volume of 15:85.

The laminate according to embodiments of the present invention achieves a balance between the excellent water vapor barrier property and the adhesion of the inorganic oxide layer, and also has high heat resistance, and thus can be suitably used for applications that require the property of reducing the influence of moisture, particularly for applications of food packaging materials.

The invention claimed is:

1. A laminate comprising a polypropylene-based resin film and an inorganic oxide layer, wherein the laminate has a water vapor transmission rate of less than 3.0 g/m²/day, the inorganic oxide layer is 0.7 N/15 mm or more in peel strength, and the laminate satisfies $SF_{145° C.}$-$SF_{121° C.} \leq 2.50$ MPa, where stress at 121° C. in a main orientation axis direction and stress at 145° C. in the main orientation axis direction, measured by thermomechanical analysis (TMA), are denoted respectively by $SF_{121° C.}$ and $SF_{145° C.}$.

2. The laminate according to claim 1, wherein the laminate satisfies $SF_{145° C.}$-$SF_{121° C.} \leq 1.80$ MPa.

3. The laminate according to claim 1, wherein tan $\delta$ of the main orientation axis direction at 145° C. is 0.25 or less.

4. The laminate according to claim 1, wherein the inorganic oxide layer has direct contact with a surface of the polypropylene-based resin film.

5. The laminate according to claim 1, wherein the inorganic oxide layer has a thickness of 2 nm or more and 30 nm or less.

6. The laminate according to claim 1, wherein the inorganic oxide layer has a thickness of 2 nm or more and less than 10 nm.

7. The laminate according to claim 1, wherein the inorganic oxide layer is a vapor-deposited layer.

8. The laminate according to claim 1, wherein a surface layer of the polypropylene-based resin film on a side in contact with the inorganic oxide layer comprises substantially no particles.

9. The laminate according to claim 1, wherein a surface of the inorganic oxide layer has an St value of 700 nm or less.

10. The laminate according to claim 1, wherein a surface of the inorganic oxide layer has an Sku value of 300 or less.

11. The laminate according to claim 1, wherein the inorganic oxide layer is an aluminum oxide layer.

12. The laminate according to any claim 1, wherein a surface of the polypropylene-based resin film with the inorganic oxide layer provided has 30 atomic % or more carbon atoms, 40 atomic % or less oxygen atoms, and 25 atomic % or less metal atoms analyzed and then detected by X-ray photoelectron spectroscopy (XPS).

13. The laminate according to claim 1, wherein F5(x)/F5 (y) is 1.3 or more and 5.0 or less, where an F5 value in the main orientation axis direction and an F5 value in a direction orthogonal to the main orientation axis are denoted respectively by F5(x) and F5(y).

14. The laminate according to claim 1, wherein the laminate has an oxygen transmission rate of 60 cc/m$^2$/day or less.

15. The laminate according to claim 1, wherein the laminate is used for a packaging material.

16. A packaging material comprising the laminate according to claim 1.

17. A packing body comprising a content packed using the packaging material according to claim 16.

* * * * *